US012340852B2

(12) United States Patent
Dong et al.

(10) Patent No.: US 12,340,852 B2
(45) Date of Patent: Jun. 24, 2025

(54) MEMORY DEVICE, MEMORY SYSTEM, AND METHOD FOR MULTI-PASS PROGRAMMING THEREOF TO REDUCE PROGRAMMING TIME

(71) Applicant: YANGTZE MEMORY TECHNOLOGIES CO., LTD., Wuhan (CN)

(72) Inventors: Zhipeng Dong, Wuhan (CN); Ke Liang, Wuhan (CN)

(73) Assignee: YANGTZE MEMORY TECHNOLOGIES CO., LTD., Wuhan (CN)

(*) Notice: Subject to any disclaimer, the term of this patent is extended or adjusted under 35 U.S.C. 154(b) by 124 days.

(21) Appl. No.: 18/122,928

(22) Filed: Mar. 17, 2023

(65) Prior Publication Data

US 2023/0326537 A1 Oct. 12, 2023

Related U.S. Application Data

(63) Continuation of application No. PCT/CN2023/079760, filed on Mar. 6, 2023.

(30) Foreign Application Priority Data

Apr. 12, 2022 (CN) ......................... 202210382032.7

(51) Int. Cl.
*G11C 16/04* (2006.01)
*G11C 16/10* (2006.01)
*G11C 16/34* (2006.01)

(52) U.S. Cl.
CPC ........ *G11C 16/3459* (2013.01); *G11C 16/102* (2013.01)

(58) Field of Classification Search
CPC .............. G11C 16/3459; G11C 16/102; G11C 11/5628; G11C 16/08; G11C 16/10; G11C 16/0483; G11C 16/32
(Continued)

(56) References Cited

U.S. PATENT DOCUMENTS 9,135,989 B2 * 9/2015 Sakai .................. G11C 11/5628
9,620,238 B2 * 4/2017 Khandelwal ....... G11C 16/3459
(Continued)

FOREIGN PATENT DOCUMENTS

CN 114882928 A 8/2022
CN 115527588 A 12/2022
(Continued)

OTHER PUBLICATIONS

International Search Report issued in corresponding International Application No. PCT/CN2023/079760, mailed May 24, 2023, 4 pages.

*Primary Examiner* — Tha-O H Bui
(74) *Attorney, Agent, or Firm* — BAYES PLLC

(57) ABSTRACT

A memory device includes a memory array including memory blocks, and a control circuit coupled to the memory array. The control circuit is configured to when multi-pass program operations are performed, during a non-last pass program of the memory cells in a first memory sub-block of a first memory block, determine verify loop counts of verify operations after programming the memory cells in the first memory sub-block of the first memory block to one or more first target program states; and when programming the memory cells in a second memory sub-block of the first memory block to the one or more first target program states using the same program and verify conditions as for the first memory sub-block of the first memory block, during the
(Continued)

non-last pass program, not perform at least the verify operation corresponding to the last of the verify loop counts.

20 Claims, 17 Drawing Sheets

(58) Field of Classification Search
USPC .................................................... 365/185.22
See application file for complete search history.

(56) References Cited

U.S. PATENT DOCUMENTS

| | | | | |
|---|---|---|---|---|
| 10,446,244 | B1 * | 10/2019 | Diep | G11C 16/0483 |
| 10,714,198 | B1 | 7/2020 | Yang et al. | |
| 11,049,578 | B1 | 6/2021 | Murai et al. | |
| 2017/0125117 | A1 | 5/2017 | Tseng et al. | |
| 2020/0211663 | A1 | 7/2020 | Baraskar et al. | |

FOREIGN PATENT DOCUMENTS

| | | | |
|---|---|---|---|
| KR | 20210069257 | A | 6/2021 |
| KR | 20210105794 | A | 8/2021 |

* cited by examiner

| | | | | | | | | | | | |
|---|---|---|---|---|---|---|---|---|---|---|---|
| PGM loop | 1 | | 2 | | 3 | | 4 | | 5 | | 6 |
| PGM pulse | Y | | Y | | Y | | Y | | Y | | Y |
| Verify pulse | | Y | | Y | | Y | | Y | | Y (pass verify here) | |

FIG. 10

| Verify Loop | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 |
|---|---|---|---|---|---|---|---|---|---|---|---|---|---|---|---|---|---|---|---|---|---|---|---|---|---|
| P1 | Y | Y | Y | Y | Y | | | | | | | | | | | | | | | | | | | | |
| P2 | | Y | Y | Y | Y | Y | | | | | | | | | | | | | | | | | | | |
| P3 | | | Y | Y | Y | Y | Y | | | | | | | | | | | | | | | | | | |
| P4 | | | | Y | Y | Y | Y | Y | Y | | | | | | | | | | | | | | | | |
| P5 | | | | | Y | Y | Y | Y | Y | Y | | | | | | | | | | | | | | | |
| P6 | | | | | | Y | Y | Y | Y | Y | Y | Y | | | | | | | | | | | | | |
| P7 | | | | | | | | Y | Y | Y | Y | Y | Y | | | | | | | | | | | | |
| P8 | | | | | | | | | Y | Y | Y | Y | Y | Y | | | | | | | | | | | |
| P9 | | | | | | | | | | Y | Y | Y | Y | Y | Y | Y | | | | | | | | | |
| P10 | | | | | | | | | | | Y | Y | Y | Y | Y | Y | Y | | | | | | | | |
| P11 | | | | | | | | | | | | | | Y | Y | Y | Y | Y | Y | | | | | | |
| P12 | | | | | | | | | | | | | | | Y | Y | Y | Y | Y | Y | Y | | | | |
| P13 | | | | | | | | | | | | | | | | | Y | Y | Y | Y | Y | Y | | | |
| P14 | | | | | | | | | | | | | | | | | | Y | Y | Y | Y | Y | Y | Y | |
| P15 | | | | | | | | | | | | | | | | | | | | | Y | Y | Y | Y | Y |

FIG. 11

| Verify Loop | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 |
|---|---|---|---|---|---|---|---|---|---|---|---|---|---|---|---|---|---|---|---|---|---|---|---|---|---|
| P1 | Y | Y | Y | Y | X | | | | | | | | | | | | | | | | | | | | |
| P2 | | Y | Y | Y | Y | X | | | | | | | | | | | | | | | | | | | |
| P3 | | | Y | Y | Y | Y | X | | | | | | | | | | | | | | | | | | |
| P4 | | | | Y | Y | Y | Y | Y | X | | | | | | | | | | | | | | | | |
| P5 | | | | | Y | Y | Y | Y | Y | X | | | | | | | | | | | | | | | |
| P6 | | | | | | Y | Y | Y | Y | Y | Y | X | | | | | | | | | | | | | |
| P7 | | | | | | | | Y | Y | Y | Y | Y | X | | | | | | | | | | | | |
| P8 | | | | | | | | | Y | Y | Y | Y | Y | X | | | | | | | | | | | |
| P9 | | | | | | | | | | Y | Y | Y | Y | Y | Y | X | | | | | | | | | |
| P10 | | | | | | | | | | | Y | Y | Y | Y | Y | Y | X | | | | | | | | |
| P11 | | | | | | | | | | | | | | Y | Y | Y | Y | Y | X | | | | | | |
| P12 | | | | | | | | | | | | | | | Y | Y | Y | Y | Y | Y | X | | | | |
| P13 | | | | | | | | | | | | | | | | | Y | Y | Y | Y | Y | X | | | |
| P14 | | | | | | | | | | | | | | | | | | Y | Y | Y | Y | Y | Y | X | |
| P15 | | | | | | | | | | | | | | | | | | | | | Y | Y | Y | Y | X |

FIG. 12

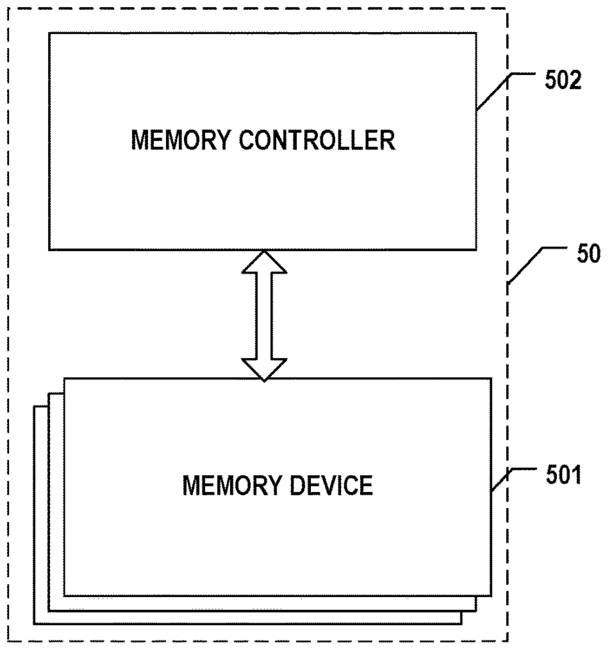
FIG. 14
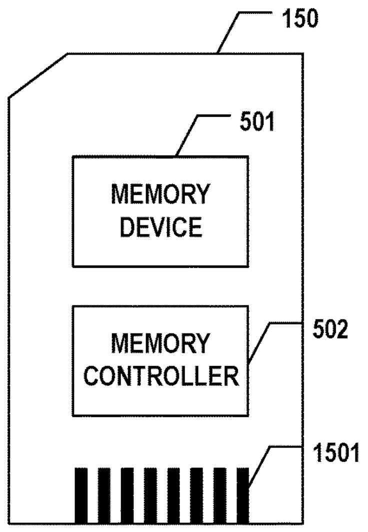
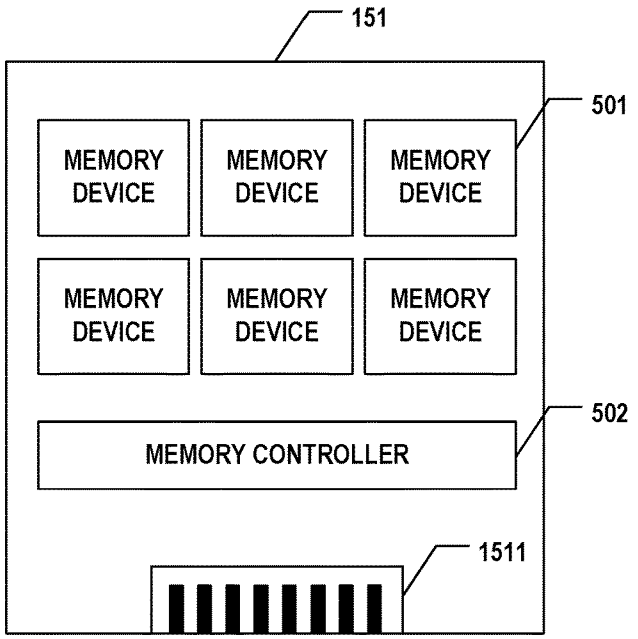
FIG. 15A
FIG. 15B

MEMORY DEVICE, MEMORY SYSTEM, AND METHOD FOR MULTI-PASS PROGRAMMING THEREOF TO REDUCE PROGRAMMING TIME

CROSS-REFERENCE TO RELATED APPLICATIONS

This application is a continuation of International Application No. PCT/CN2023/079760, filed on Mar. 6, 2023, and entitled "MEMORY DEVICE, MEMORY SYSTEM, AND METHOD OF OPERATING THE SAME," which claims the benefit of priority to Chinese Application No. 202210382032.7, filed on Apr. 12, 2022, both of which are incorporated by reference herein in their entireties.

BACKGROUND

The present disclosure relates to a memory device, a memory system, and a method of operating the same.

Nonvolatile memories have been widely used in electronic devices in various fields. Flash memory is one of the most widely used nonvolatile memories that can be electrically erased and reprogrammed. Flash memory can include memories of both NOR and NAND architectures. The threshold voltage of each memory cell in the flash memory is changed to a required level to realize various operations, such as reading, programming, and erasing. When operating the flash memory, the erase operation can be performed at a memory block level, the program operation can be performed at a page level, and the read operation can be performed at a memory cell level. Programming of multi-state flash memory can be accomplished by identifying multiple different allowable threshold voltage ranges. The programming of the memory cells of the multi-programming state flash memory often adopts multi-pass programming in which the programming operation and the verification operation are alternately performed. As such, the programming time is relatively long.

SUMMARY

In one aspect, a memory device includes a memory array having memory blocks, each of the memory blocks includes memory sub-blocks, and each of the memory sub-blocks includes at least one memory cell. The memory device further includes a control circuit coupled to the memory array. The control circuit is configured to: when multi-pass program operations are performed on a first memory block of the memory blocks, during a non-last pass program of the memory cells in a first memory sub-block of the first memory block, determine verify loop counts of verify operations after programming the memory cells in the first memory sub-block of the first memory block to one or more first target program states, and when programming the memory cells in a second memory sub-block of the first memory block to the one or more first target program states using the same program and verify conditions as for the first memory sub-block of the first memory block, during the non-last pass program of the memory cells in the second memory sub-block of the first memory block, not perform at least the verify operation corresponding to the last of the verify loop counts.

In some implementations, programming the memory cells in the first memory sub-block of the first memory block to one or more first target program states includes programming the memory cells in the first memory sub-block of the first memory block to multiple first target program states.

In some implementations, when programming the memory cells in the first memory sub-block of the first memory block to the multiple first target program states, the control circuit is further configured to: during the non-last pass program of the memory cells in the first memory sub-block of the first memory block, determine each verify loop count of corresponding verify operations after programming the memory cells in the first memory sub-block of the first memory block to each of the first target program states.

In some implementations, the control circuit is further configured to: during the non-last pass program of the memory cells in the second memory sub-block of the first memory block, set a number of verify operations that needs to be performed on the memory cells in the second memory sub-block of the first memory block according to each of the determined verify loop counts corresponding to the each of the first target program states.

In some implementations, the multi-pass program operations are performed on the first memory block of the memory blocks by programming memory cells in the first memory block to first verify levels with a first Incremental Step Pulse Program (ISPP) having a first step size during a first pass program and programming the memory cells to be second verify levels with a second ISPP having a second step size during a last pass program, wherein the first step size is larger than the second step size.

In some implementations, the control circuit is configured to: when multi-pass program operations are performed on a second memory block of the memory blocks, during a non-last pass program of memory cells in a first memory sub-block of the second memory block, determine verify loop counts of verify operations after programming the memory cells in the first memory sub-block of the second memory block to one or more second target program states, and when programming the memory cells in a second memory sub-block of the second memory block to the one or more second target program states using the same program and verify conditions as for the first memory sub-block of the second memory block, during the non-last pass program of the memory cells in the second memory sub-block of the second memory block, not perform at least the verify operation corresponding to the last of the verify loop counts.

In some implementations, the memory array is a three-dimensional NAND memory array.

In another aspect, a memory device includes a memory array having memory blocks, each of the memory blocks comprises memory sub-blocks, and each of the memory sub-blocks comprises at least one memory cell. The memory device further includes a control circuit coupled to the memory array. The control circuit is configured to: when multi-pass program operations are performed on a first memory block of the memory blocks, during a non-last pass program of the memory cells in a first memory sub-block of the first memory block, determine m verify loop counts of verify operations after programming the memory cells in the first memory sub-block of the first memory block to one or more first target program states, where m is an integer, and when programming the memory cells in a second memory sub-block of the first memory block to the one or more first target program states using the same program and verify conditions as for the first memory sub-block of the first memory block for n times, where n is an integer, and n is more than 1 and less than m, during the n+1th to mth pass program of the memory cells in the second memory sub-block of the first memory block, applying the program voltage to the memory cells in the second memory sub-block of the first memory block using the same program conditions as for the first memory sub-block of the first memory block.

In some implementations, the control circuit is configured to: when programming the memory cells in the second memory sub-block of the first memory block to the one or more first target program states using the same program and verify conditions as for the first memory sub-block of the first memory block for n times, where n is an integer, and n is more than 1 and less than m, after m+1th pass program of the memory cells in the second memory sub-block of the first memory block, prohibiting applying the program voltage to the memory cells in the second memory sub-block of the first memory block.

In some implementations, prohibiting applying the program voltage to the memory cells in the second memory sub-block of the first memory block is performed by increasing a bit line voltage applied to bit lines coupled to the memory array.

In still another aspect, a program operation method for a memory device is provided. The memory device includes a memory array, the memory array includes memory blocks, each of the memory blocks includes memory sub-blocks, and each of the memory sub-blocks includes at least one memory cell. The program operation method includes: when multi-pass program operations are performed on a first memory block of the memory blocks, during a non-last pass program of memory cells in a first memory sub-block of the first memory block, determining verify loop counts of verify operations after programming the memory cells in the first memory sub-block of the first memory block to one or more first target program states, and when programming the memory cells in a second memory sub-block of the first memory block to the one or more first target program states using the same program and verify conditions as for the first memory sub-block of the first memory block, during the non-last pass program of the memory cells in the second memory sub-block of the first memory block, not performing at least the verify operation corresponding to the last of the verify loop counts.

In some implementations, programming the memory cells in the first memory sub-block of the first memory block to one or more first target program states further includes: programming the memory cells in the first memory sub-block of the first memory block to multiple first target program states.

In some implementations, when programming the memory cells in the first memory sub-block of the first memory block to the multiple first target program states, the method further includes: during the non-last pass program of memory cells in the first memory sub-block of the first memory block, determining each verify loop counts of corresponding verify operations after programming the memory cells in the first memory sub-block of the first memory block to each of the first target program states.

In some implementations, the method further includes: during the non-last pass program of the memory cells in the second memory sub-block of the first memory block, setting a number of verify operations that needs to be performed on the memory cells in the second memory sub-block of the first memory block according to each of the determined verify loop counts corresponding to the each of the first target program states.

In some implementations, the multi-pass program operations are performed on the first memory block of the memory blocks by programming memory cells in the first memory block to first verify levels with a first Incremental Step Pulse Program (ISPP) having a first step size during a first pass program and programming the memory cells to be second verify levels with a second ISPP having a second step size during a last pass program, wherein the first step size is larger than the second step size.

In some implementations, the method further includes: when multi-pass program operations are performed on a second memory block of the memory blocks, during a non-last pass program of memory cells in a first memory sub-block of the second memory block, determining verify loop counts of verify operations after programming the memory cells in the first memory sub-block of the second memory block to one or more second target program states, and when programming the memory cells in a second memory sub-block of the second memory block to the one or more second target program states using the same program and verify conditions as for the first memory sub-block of the second memory block, during the non-last pass program of the memory cells in the second memory sub-block of the second memory block, not performing at least the verify operation corresponding to the last of the verify loop counts.

In yet still another aspect, a memory system includes: a memory device. The memory device includes: a memory array having memory blocks, each of the memory blocks includes memory sub-blocks, and each of the memory sub-blocks includes at least one memory cell. The memory device further includes a control circuit coupled to the memory array. The control circuit is configured to: when multi-pass program operations are performed on a first memory block of the memory blocks, during a non-last pass program of the memory cells in a first memory sub-block of the first memory block, determine verify loop counts of verify operations after programming the memory cells in the first memory sub-block of the first memory block to one or more first target program states, and when programming the memory cells in a second memory sub-block of the first memory block to the one or more first target program states using the same program and verify conditions as for the first memory sub-block of the first memory block, during the non-last pass program of the memory cells in the second memory sub-block of the first memory block, not perform at least the verify operation corresponding to the last of the verify loop counts. The memory system further includes a memory controller coupled to the memory device and configured to control the memory device.

In some implementations, when programming the memory cells in the first memory sub-block of the first memory block to multiple first target program states, the control circuit is further configured to: during the non-last pass program of the memory cells in the first memory sub-block of the first memory block, determine each verify loop count of corresponding verify operations after programming the memory cells in the first memory sub-block of the first memory block to each of the first target program states.

In some implementations, the control circuit is further configured to: during the non-last pass program of the memory cells in the second memory sub-block of the first memory block, set a number of verify operations that needs to be performed on the memory cells in the second memory sub-block of the first memory block according to each of the determined verify loop counts corresponding to the each of the first target program states.

In some implementations, the multi-pass program operations are performed on the first memory block of the memory blocks by programming memory cells in the first memory block to first verify levels with a first Incremental Step Pulse Program (ISPP) having a first step size during a first pass program and programming the memory cells to be second verify levels with a second ISPP having a second step size during a last pass program. The first step size is larger than the second step size.

In some implementations, the control circuit is configured to: when multi-pass program operations are performed on a second memory block of the memory blocks, during a non-last pass program of memory cells in a first memory sub-block of the second memory block, determine verify loop counts of verify operations after programming the memory cells in the first memory sub-block of the second memory block to one or more second target program states, and when programming the memory cells in a second memory sub-block of the second memory block to the one or more second target program states using the same program and verify conditions as for the first memory sub-block of the second memory block, during the non-last pass program of the memory cells in the second memory sub-block of the second memory block, not perform at least the verify operation corresponding to the last of the verify loop counts.

In some implementations, the memory array is a three-dimensional (3D) NAND memory array, and the memory device is a 3D NAND memory device.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

FIG. 10 is a schematic diagram of performing a programming operation and a verification operation when a predictive Failure Bit Count (FBC) verification strategy is used according to implementations of the present disclosure;

FIG. 11 is a schematic diagram of determining the verification information required for programming the memory cells coupled to the word line WL10 in String® to each programming data state according to implementations of the present disclosure after adopting the programming method according to implementations of the present disclosure;

FIG. 12 is the verification information required for programming the memory cells coupled to the word line WL10 in String1, String2, and String3 to each programming data state according to implementations of the present disclosure after adopting the programming method according to implementations of the present disclosure schematic diagram;

FIG. 14 is a schematic structural diagram of a memory system according to implementations of the present disclosure;

FIG. 15A is a schematic diagram of an exemplary memory card with a memory system according to implementations of the present disclosure; and FIG. 15B is a schematic diagram of an exemplary solid-state drive (SSD) with a memory system according to implementations of the present disclosure.

The present disclosure will be described with reference to the accompanying drawings.

DETAILED DESCRIPTION

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be noted that, in the implementations provided by the present disclosure, the term "include," "comprise," or any other variation thereof is intended to cover a non-exclusive inclusion, so that a method or device including a series of elements not only includes the explicitly described elements, but also include other elements not explicitly listed, or also include elements inherent to the implementation of the method or apparatus. Without further limitations, an element defined by the phrase "comprising a" . . . " does not preclude the presence of additional related elements in the method or device comprising the element, such as a step in the method or a unit in the device. The unit, for example, may be a part of a circuit, a part of a processor, a part of a program or software, and the like.

Although the memory device in the present disclosure is shown as a NAND flash memory, it is to be understood that the solutions or techniques of the present disclosure are not limited to application in NAND flash memory, and can be applied to other types of memory devices, such as electrically erasable programmable read-only memory (EE- PROM), NOR flash, phase change random access memory (PRAM), magnetic RAM (MRAM), resistive RAM (RRAM), ferroelectric RAM (FRAM), etc.

The present disclosure will be described in further detail below in conjunction with the accompanying drawings and specific implementations.

Figure 1:
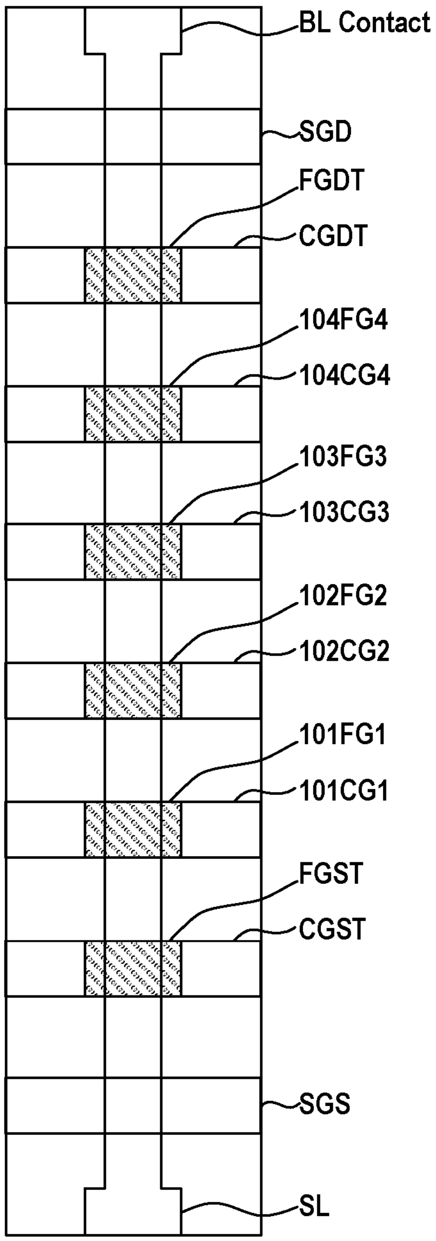
FIG. 1 is the top view of a NAND string according to the implementations of the present disclosure.
Figure 2:
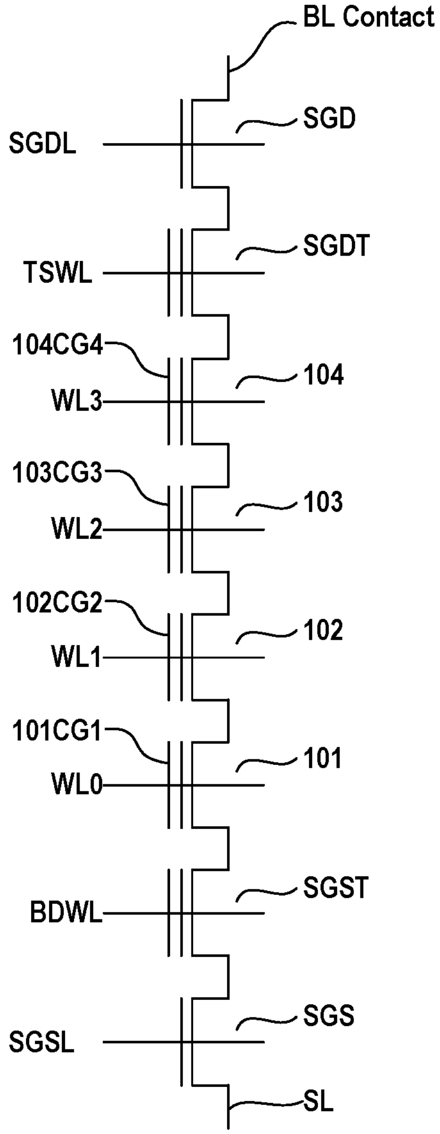
FIG. 2 is the equivalent circuit diagram of a NAND string according to the implementations of the present disclosure.

FIG. 1 is the top view of a NAND string according to some implementations of the present disclosure, and FIG. 2 is an equivalent circuit diagram of the NAND string shown in FIG. 1. In a NAND-based flash memory system, multiple transistors are arranged in series and between two select gates (source gate and drain gate). A series connection of transistors and two select gates is called a NAND string. A NAND string, as shown in FIGS. 1 and 2, may include a top select gate SGD (on the drain side), a bottom select gate SGS (on the source side), a top dummy transistor SGDT, four transistors 101-104, and the bottom preset transistor SGST between the top select gate SGD and the bottom select gate SGS. The top select gate SGD connects the NAND string to the bit line through the bit line contact; the top select gate SGD is controlled by applying a suitable voltage to the top select gate line SGDL. The bottom select gate SGS connects the NAND string to the source line; the bottom select gate SGS is controlled by applying a suitable voltage to the bottom select gate line SGSL. Each of the top dummy transistors SGDTs, the four transistors 101-104, and the bottom preset transistor SGST includes a control gate and a floating gate. For example, the top dummy transistor SGDT includes a control gate CGDT and a floating gate FGDT; transistor 101 includes a control gate 101CG1 and a floating gate 101FG1; transistor 102 includes a control gate 102CG1 and a floating gate 102FG1; transistor 103 includes a control gate 103CG1 and a floating gate 103FG1; transistor 104 includes a control gate 104CG1 and a floating gate 104FG1; the bottom dummy transistor SGST includes a control gate CGST and a floating gate FGST. The control gate CGST is connected to the bottom dummy word line BDWL; control gate 101CG1—control gate 104CG1 are respectively connected to word lines WL0-WL3; the control gate CGDT is connected to the top dummy word line TSWL.

It should be noted that FIGS. 1 and 2 are only exemplary illustrations of four memory cells (transistors 101-104) used for read and write operations, and two dummy memory cells (top dummy transistor SGDT and bottom dummy transistor SGST) used for read and write tests. In practical applications, the NAND string can include 8, 16, 32, 64, 128 memory cells, etc. That is, the number of memory cells or dummy memory cells in the NAND string does not limit the scope of the present disclosure. Furthermore, a typical structure of a flash memory system using a NAND structure includes multiple NAND strings. Each NAND string is connected to a source line through a bottom select gate SGS controlled by a bottom select gate line SGSL, and to a corresponding bit line through a top select gate SGD controlled by a top select gate line SGDL. Each bit line and a corresponding NAND string (single or multiple) connected to that bit line via a bit line contact form a column in the array of memory cells. Bit lines are shared by multiple NAND strings. Typically, bit lines run on top of the NAND strings in a direction perpendicular to the word lines, connected to one or more sense amplifiers. It should be understood that the present disclosure only utilizes the exemplary structures in FIGS. 1 and 2 to illustrate the NAND string structure. In practical applications, the charge-trapping layer is not necessarily a floating gate, but may also be a trapping nitride layer, a non-conductive dielectric material, or the like.

Figure 3:
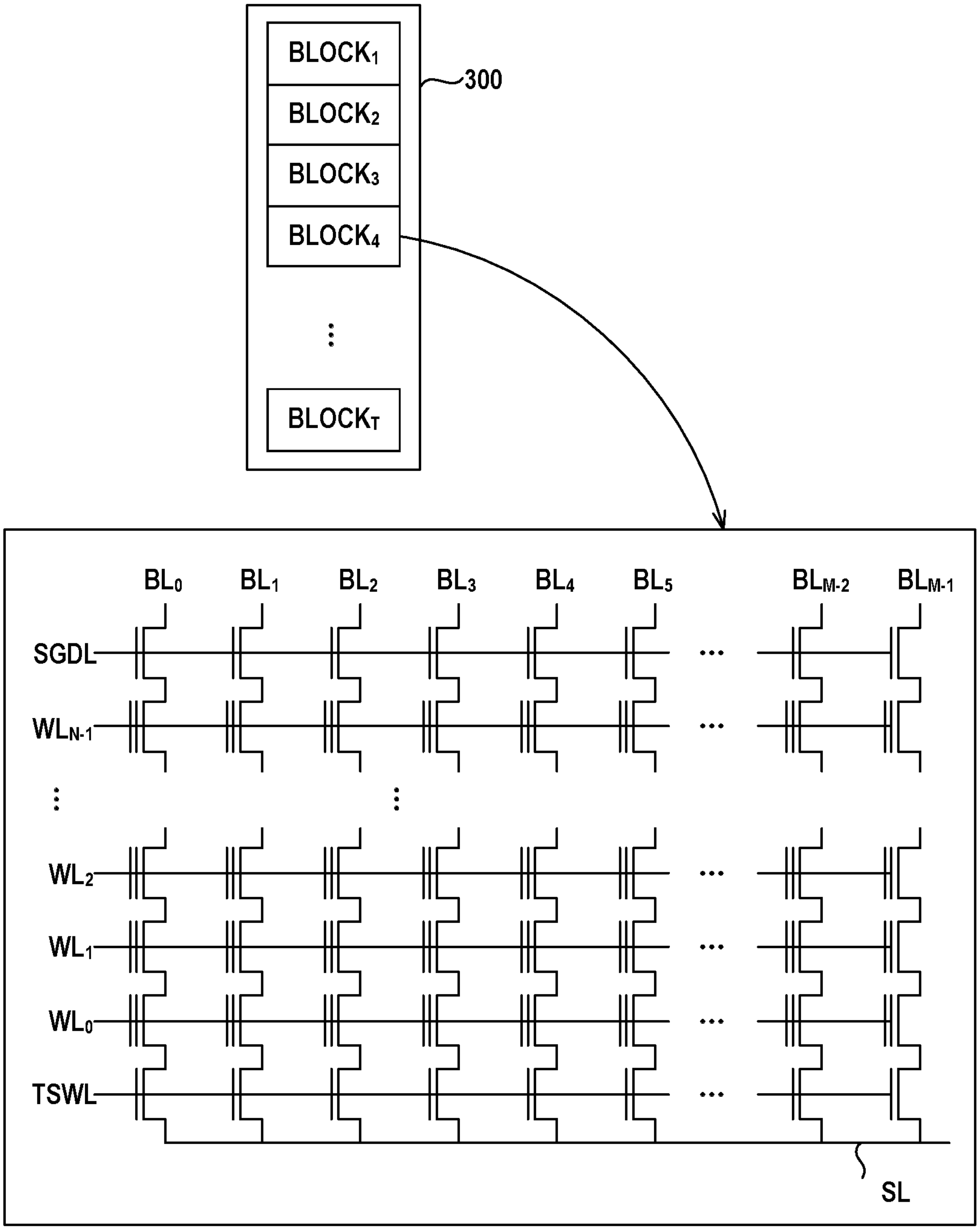
FIG. 3 is a schematic diagram of an array structure of a memory cell according to implementations of the present disclosure.

In practical application, the memory array in the memory device is a memory array with a plurality of memory blocks formed therein after the proper layout of the NAND strings, as shown in FIG. 1 and FIG. 2, and its exemplary structure, as shown in FIG. 3. Memory array 300 is divided into memory arrays with multiple memory blocks $BLOCK_1$-$BLOCK_T$, where T is a positive integer. Each memory block contains a set of NAND strings, which are accessed via bit lines $BL_0$-$BL_{M-1}$, and a set of common word lines $WL_0$-$WL_{N-1}$, where M and N are both integers greater than 1. One end of the NAND string is connected to the corresponding bit line via the top select gate SGD (controlled by the top select gate line SGDL), and the other end is connected to the source line via the bottom select gate SGS (controlled by the bottom select gate line SGSL). Each memory block is divided into multiple pages. In some implementations, a memory block is generally a unit for erase operations, and a page is generally a unit for program operations. In some implementations, other units of erase or program may also be used. In an example, the physical structure of memory cells in a memory array, as shown in FIG. 3 does not limit the scope of the present disclosure.

In the present disclosure, the memory array shown in FIG. 3 may be arranged in a 3D quad-level cell (QLC) structure. And it should be noted that other structural arrangements do not limit the scope of the present disclosure.

Figure 4:
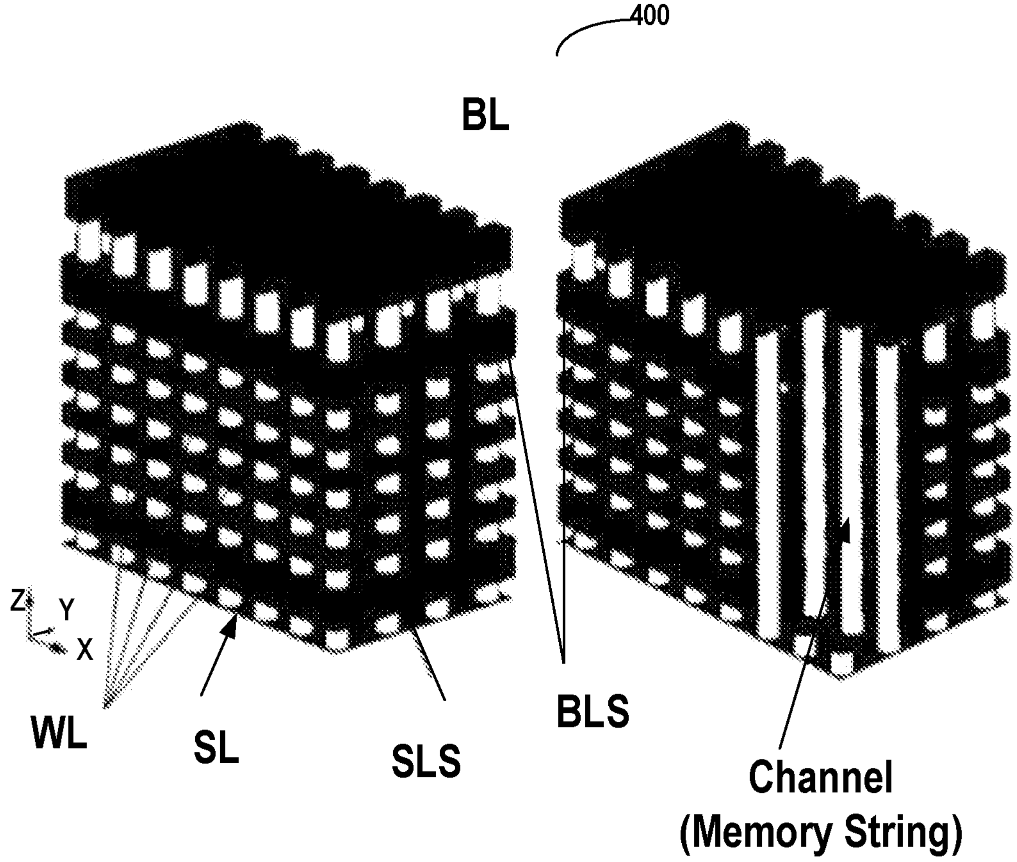
FIG. 4 is a perspective view of a part of an exemplary scheme of a single-block three-dimensional (3D) memory array according to implementations of the present disclosure.

For the structure of each memory block, as shown in FIG. 4, it illustrates a perspective view of a part of an exemplary scheme of a three-dimensional memory array of a single memory block according to some implementations of the present disclosure. Referring to FIG. 4, a memory block 400 includes a plurality of layers stacked on a substrate (not shown) and parallel to the surface of the substrate. FIG. 4 shows four word lines (WL) on four layers, denoted as WL0 to WL3. The memory block 400 is also arranged with a plurality of channels perpendicular to the word lines. The intersection of a word line and a channel forms a memory cell, so that a channel intersected with multiple word lines can also be called a memory cell string. Those skilled in the art should understand that the number of word lines and the number of memory cell strings (e.g., channels) in the memory block 400 are not limited to specific values. For example, the memory block 400 may include 64 word lines and 64 memory cells formed by crossing the 64 word lines with one memory cell string (channel). For another example, the number of memory cell strings included in the memory block 400 may be calculated on order of one hundred thousand, one million, or even greater. A word line includes millions of memory cells formed by intersecting, for example, several million memory cell strings. The memory cell in the memory block 400 may be a single-level memory cell or a multi-level memory cell. The single-level memory cell may be a single-level cell (SLC) capable of storing 1 bit; the multi-level memory cell can be a multi-level cell (MLC) capable of storing 2 bits, a triple-level cell (TLC) capable of storing 3 bits, a quad-level cell (QLC) capable of storing 4 bits, or a penta-level cell (PLC) capable of storing 5 bits. As shown in FIG. 4, the memory block 400 also includes a bit line (BL), a bit line selector (BLS, which can also be called the top selection gate line SGDL), a source line (SL), a source selection line (SLS, may also be referred to as the bottom select gate line SGSL). These circuit lines, together with word lines (WL), enable the addressing of any memory cell in memory block 400.

In some implementations, the memory block 400 can be logically divided into a plurality of memory sub-blocks. A plurality of memory cells coupled to a word line in a memory sub-block may be referred to as a memory cell page or a memory page. In some implementations, programming of a memory block may be performed in units of a memory page.

Figure 5:
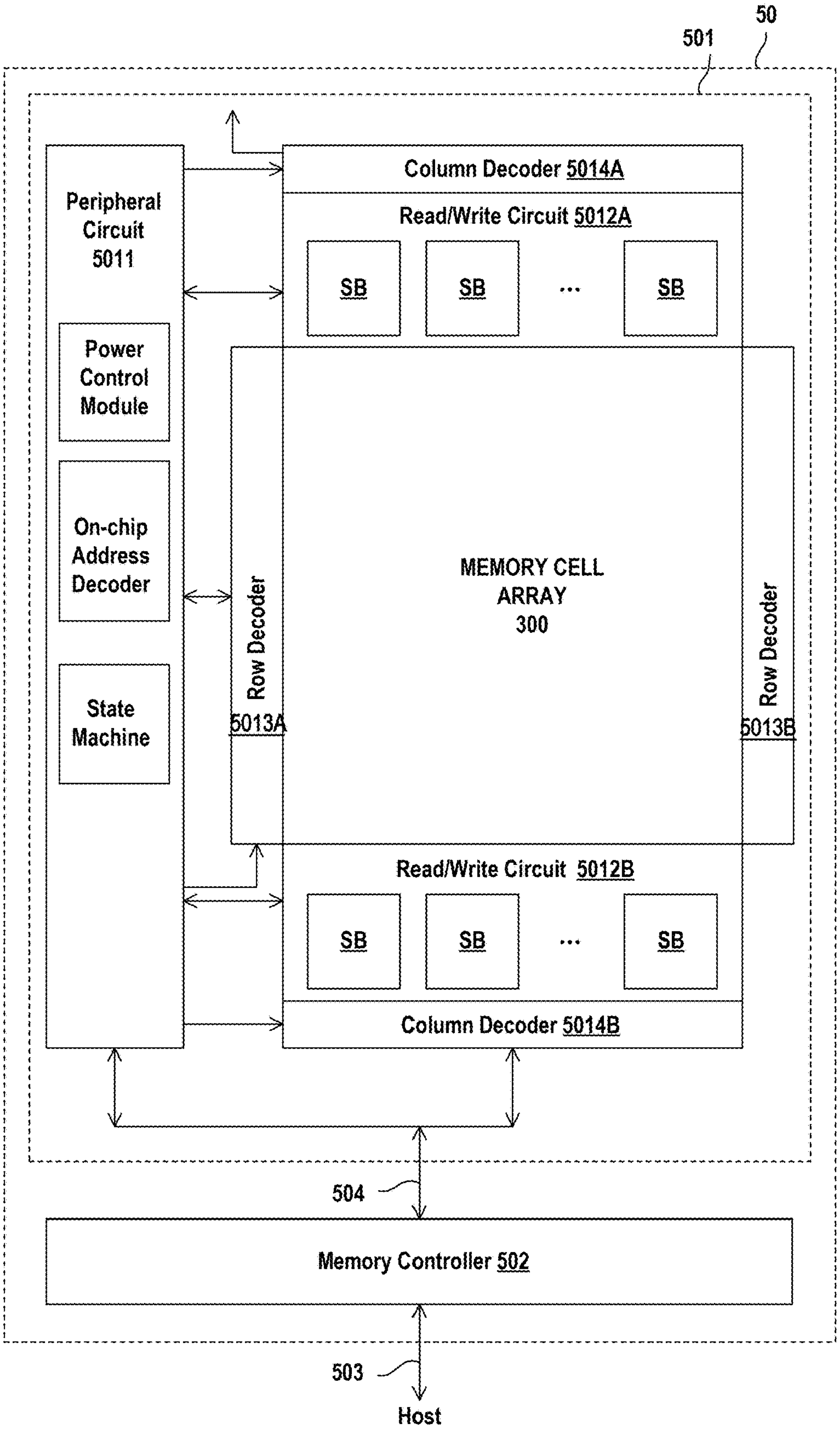
FIG. 5 is a schematic structural diagram of a memory device having a read/write circuit for parallel reading and programming of memory cells according to implementations of the present disclosure.

Based on the memory array shown in FIG. 3, FIG. 5 shows a schematic structural diagram of a memory system providing read and write circuits for reading and/or programming pages (or other units) of the memory array in parallel, according to some implementations of the present disclosure.

The memory system 50 includes a memory device 501 and a controller 502. Memory device 501 includes a memory array 300 (two-dimensional or three-dimensional), a control circuit 5011, read/write circuits 5012A and 5012B, row decoders 5013A and 5013B, and column decoders 5014A and 5014B. In some implementations, access to memory array 300 by various control circuits is implemented in a symmetrical manner on opposite sides of memory array 300 to reduce the density of access and circuitry on each side by half. The read/write circuits 5012A and 5012B include a plurality of sense blocks SB for reading or programming pages of the memory array 300 in parallel. Memory array 300 is addressable by word lines via row decoders 5013A and 5013B, and by bit lines via column decoders 5014A and 5014B. In some implementations, memory array 300, control circuit 5011, read/write circuits 5012A and 5012B, row decoders 5013A and 5013B, and column decoders 5014A and 5014B may be fabricated on-chip. The dotted box in the middle of FIG. 5 may also represent a chip. External signals and data are transferred between the host and the controller 502 via the signal line 503, and are transferred between the controller 502 and the chip through the signal line 504. Control circuit 5011 is configured to cooperate with the read/write circuits 5012A and 5012B to perform memory operations on the memory array 300. Control circuit 5011 includes a state machine, an on-chip address decoder, and a power control module. The state machine is configured to provide chip-level control of memory operations; the on-chip address decoder is configured to provide an address interface between the address used by the host or the controller of the memory system to the hardware address used by the row decoders 5013A and 5013B, and the column decoders 5014A and 5014B; and the power control module is configured to provide power and voltage to word lines and bit lines during each memory operation device control.

The memory arrays in the memory systems discussed above can be erased, programmed, and read. Since the memory cells in the memory system can be arranged as single-level cells or multi-level cells, and the multi-level cells can be divided into MLC, TLC, QLC, etc. Therefore, for a page of memory, at the end of a successful programming process (with verification), the threshold voltages of the programmed memory cells should be within one or more voltage distributions. In the actual application, different types of memory cells may have different data states. Specifically, FIGS. 6A to 6D, respectively, show the threshold voltage distribution curves of memory cells in SLC, MLC, TLC, and QLC.

Figure 6A:
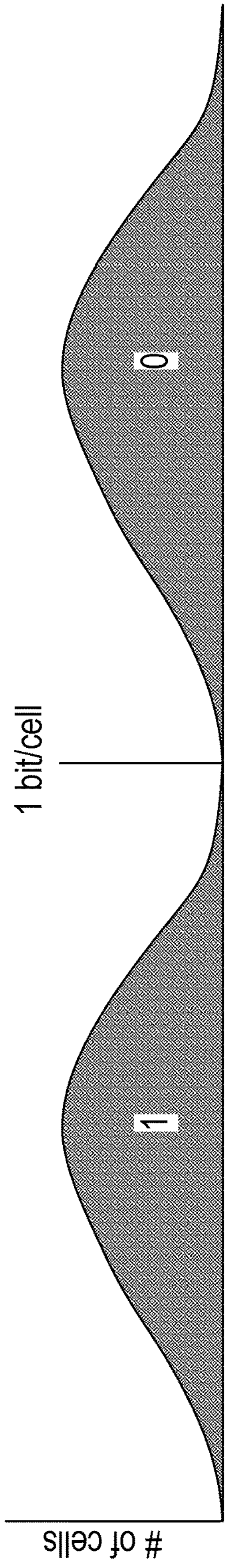
FIGS. 6A-6D are threshold voltage distributions of memory cells according to implementations of the present disclosure.

As shown in FIG. 6A, SLC corresponds to two threshold voltage distributions: E and P, where the threshold voltage distribution E corresponds to the erasing data state; the threshold voltage distribution P corresponds to the programming data state. The threshold voltage of the erasing data state corresponding to the threshold voltage distribution E is smaller than that of the programming data state corresponding to the threshold voltage distribution P. Therefore, memory cells with threshold voltages in threshold voltage distribution E are in the erased data state; memory cells with threshold voltages in threshold voltage distribution P are in the programmed data state. In some implementations, an SLC-type memory cell stores one bit of data. Specifically, an erased memory cell stores data 1, and a programmed memory cell stores data 0.

Figure 6B:
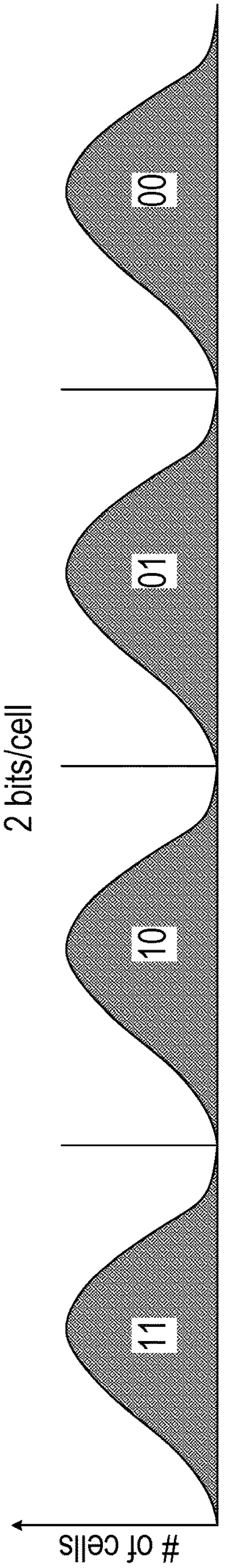

As shown in FIG. 6B, MLC corresponds to four threshold voltage distributions: E, P1, P2, and P3, and the threshold voltages increase sequentially. Likewise, the threshold voltage distribution E corresponds to the erase data state; the threshold voltage distributions P1, P2, and P3 correspond to the program state. In some implementations, an MLC-type memory cell stores two bits of data. Specifically, the erased memory cells store data 11, the memory cells programmed to the P1 data state store data 10, the memory cells programmed to the P2 data state store data 01, and the memory cells programmed to the P3 data state store data 00.

Figure 6C:
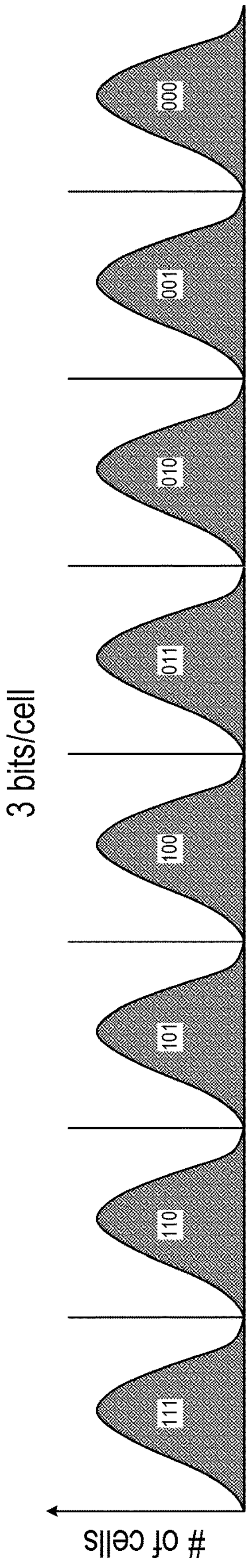

As shown in FIG. 6C, TLC corresponds to eight threshold voltage distributions: E, S1, S2, S3, S4, S5, S6, and S7, and the threshold voltages increase sequentially. Similarly, the threshold voltage distribution E corresponds to the erasing data state; the threshold voltage distributions S1, S2, S3, S4, S5, S6, and S7 correspond to the programming data state. In some implementations, a TLC-type memory cell stores three bits of data. Specifically, the erased memory cells can store data 111, the memory cells programmed to the S1 data state store data 110, the memory cells programmed to the S2 data state store data 101, the memory cells programmed to the S3 data state store data 100, the memory cells programmed to the S4 data state store data 011, the memory cells programmed to the S5 data state store data 010, the memory cells programmed to the S6 data state store data 001, the memory cells programmed to the S7 data state store data 000.

Figure 6D:
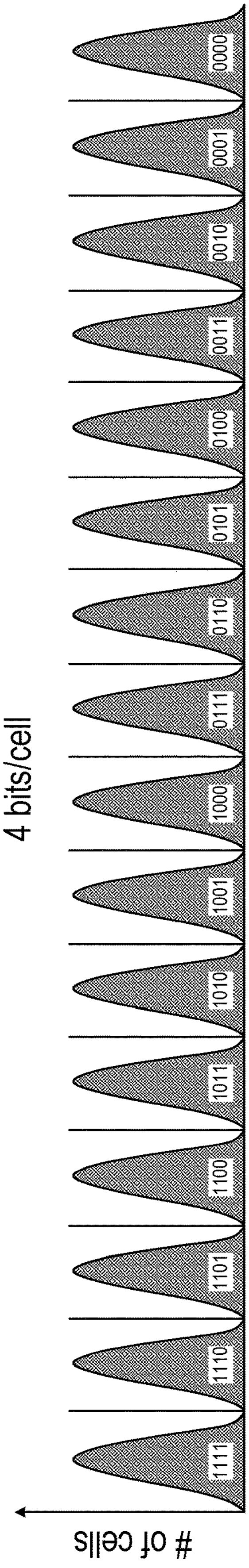

As shown in FIG. 6D, in QLC, it corresponds to five threshold voltage distributions: E, L1, L2, L3, L4, L5, L6, L7, L8, L9, L10, L11, L12, L13, L14, and L15, and the threshold voltages increase sequentially. Similarly, the threshold voltage distribution E corresponds to the erasing data state; the threshold voltage distribution L1, L2, L3, L4, L5, L6, L7, L8, L9, L10, L11, L12, L13, L14, and L15 corresponds to the programming data state. For data state N, the data state N has a higher threshold voltage than data state N−1 and a lower threshold voltage than data state N+1. In some implementations, a QLC-type memory cell stores four bits of data. Specifically, the erased memory cells can store data 1111, and the memory cells programmed to the L1, L2, L3, L4, L5, L6, L7, L8, L9, L10, L11, L12, L13, L14, and L15 can store data 1110, 1101, 1100, 1011, 1010, 1001, 1000, 0111, 0110, 0101, 0100, 0011, 0010, 0001, and 0000, respectively.

It should be noted that, regardless of the type of memory cell mentioned above, each threshold voltage distribution (data state) corresponds to a predetermined value of a group of data bits stored in the memory cell. The specific relationship between the data programmed into the memory cell and the threshold voltage level of the memory cell depends on the data encoding scheme adopted by the memory cell. For example, the encoding scheme may use a Gray code.

In practical applications, for flash memory devices with multiple data states, such as NAND flash memory devices, in order to reduce coupling and interference between word lines when programming memory cells, in some implementations, for memory pages or blocks, multi-pass programming can be used for programming to achieve tighter threshold voltage distributions. In some implementations, the multi-pass programming may include two-pass programming, three-pass programming, etc. The two-pass programming may include first-pass coarse programming and fine programming; the three-pass programming may include first-pass coarse programming, second-pass coarse programming, and fine programming. Here, the last pass of the multi-pass programming is fine programming; the first-pass coarse programming and the second-pass coarse programming are collectively called coarse programming, and may also be called non-last pass programming, according to some implementations of the present disclosure.

Figure 7:
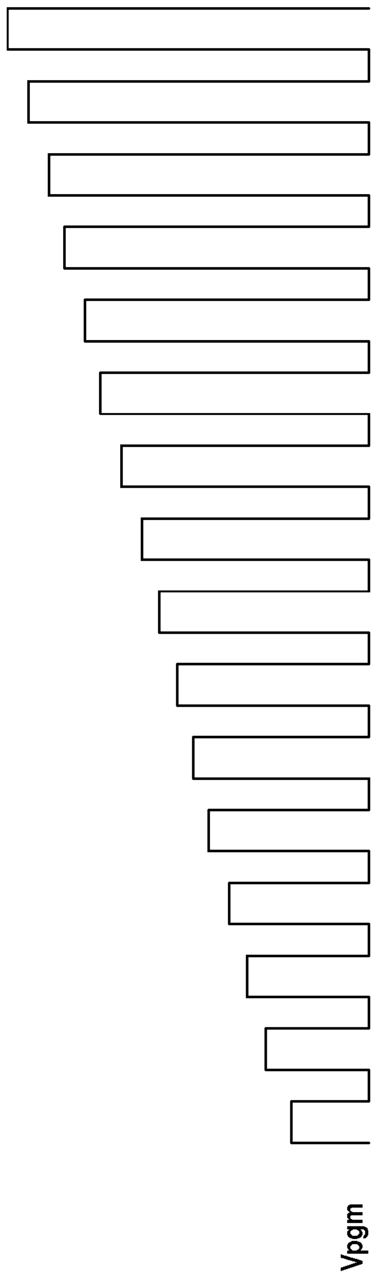
FIG. 7 is a schematic structural diagram of a stepping pulse in an Incremental Step Pulse Programming (ISPP) mode according to implementations of the present disclosure.

In some implementations, both non-last pass programming and fine programming can be incremental step pulse programming (ISPP). The memory cells in the memory page are programmed several times, where the incremental step programming pulse Vpgm can refer to FIG. 7.

In order to take into account the programming speed and have a wider read window margin (RWM), in some implementations, in the non-last programming pass (e.g., each coarse programming stage), a programming voltage pulse with a larger set step size (for example, 0.5 volts (V)) is applied to the selected word line (e.g., a word line that is selected coupling the memory cell to be programmed), so that the memory cell coupled to the selected word line can be quickly programmed to an intermediate data state. In the fine programming stage performed after each coarse programming stage, a programming voltage pulse with a small set step size (for example, 0.2V) is applied on the selected word line, so that the voltage coupled to the selected word line memory cells is accurately programmed to their final data state. That is, in some implementations, in each pass of the multi-pass programming, the programming voltage/pulse applied in the programming operation increases according to different set step sizes, and the specific set step size can be determined according to the actual programming situation set by the designer. It is noted that the intermediate data state is one or more data states before the programmed memory cell reaches the final data state. For example, when programming a TLC-type memory cell, the final data state of a certain memory cell is S3, and the intermediate data state can be at least one of S1 and S2. However, other verifiable data states are also possible. The final data state is the data state to which the user expects the programmed memory cell to be programmed. For example, when programming the TLC-type memory cell mentioned above, the final data state is S3.

Figure 8:
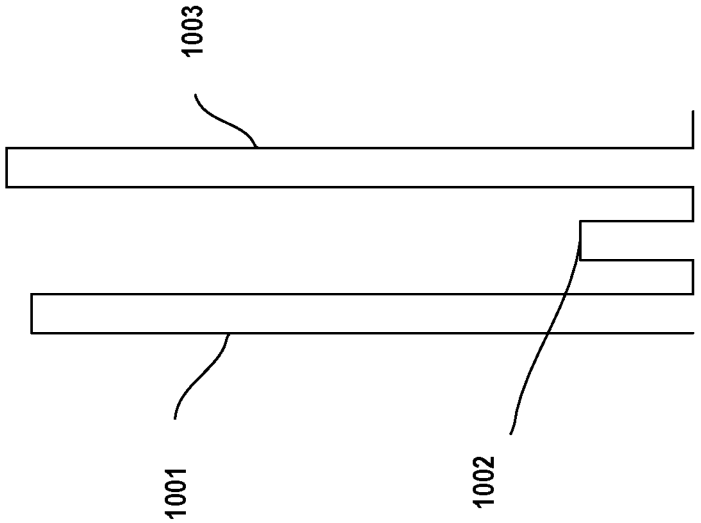
FIG. 8 is a schematic diagram of a verification voltage pulse according to implementations of the present disclosure.

It should be understood that during the programming of memory cells, in order to know whether the programmed memory cells are programmed to the target programming data state, between applying two programming voltage pulses (the process of applying programming voltage pulses is also called a programming operation), a verification operation may be added to determine whether the programmed memory cell is programmed to the target data state. That is, the programming operation and the verification operation are performed alternately. The verification operation can be one or a group of verification voltage pulses, and the verification voltage pulses are shown in FIG. 8. In FIGS. 8, 1001 and 1003 are incremental step programming pulses Vpgm; and 1002 is a verification voltage pulse. Based on the foregoing description, the multi-pass programming may include at least one pass coarse programming and one pass fine programming, and each pass programming includes at least one programming operation and at least one verifying operation.

However, it is found that the above-mentioned multi-pass programming method in which programming operations and verification operations are alternately performed requires more verification operations, thus slowing down the programming process. In other words, during programming, in order to increase the reliability of programming, the use of verify operations after each program operation results in some unnecessary verify operations, thereby increasing the time required for programming (tPROG) and reducing programming speed.

Figure 9:
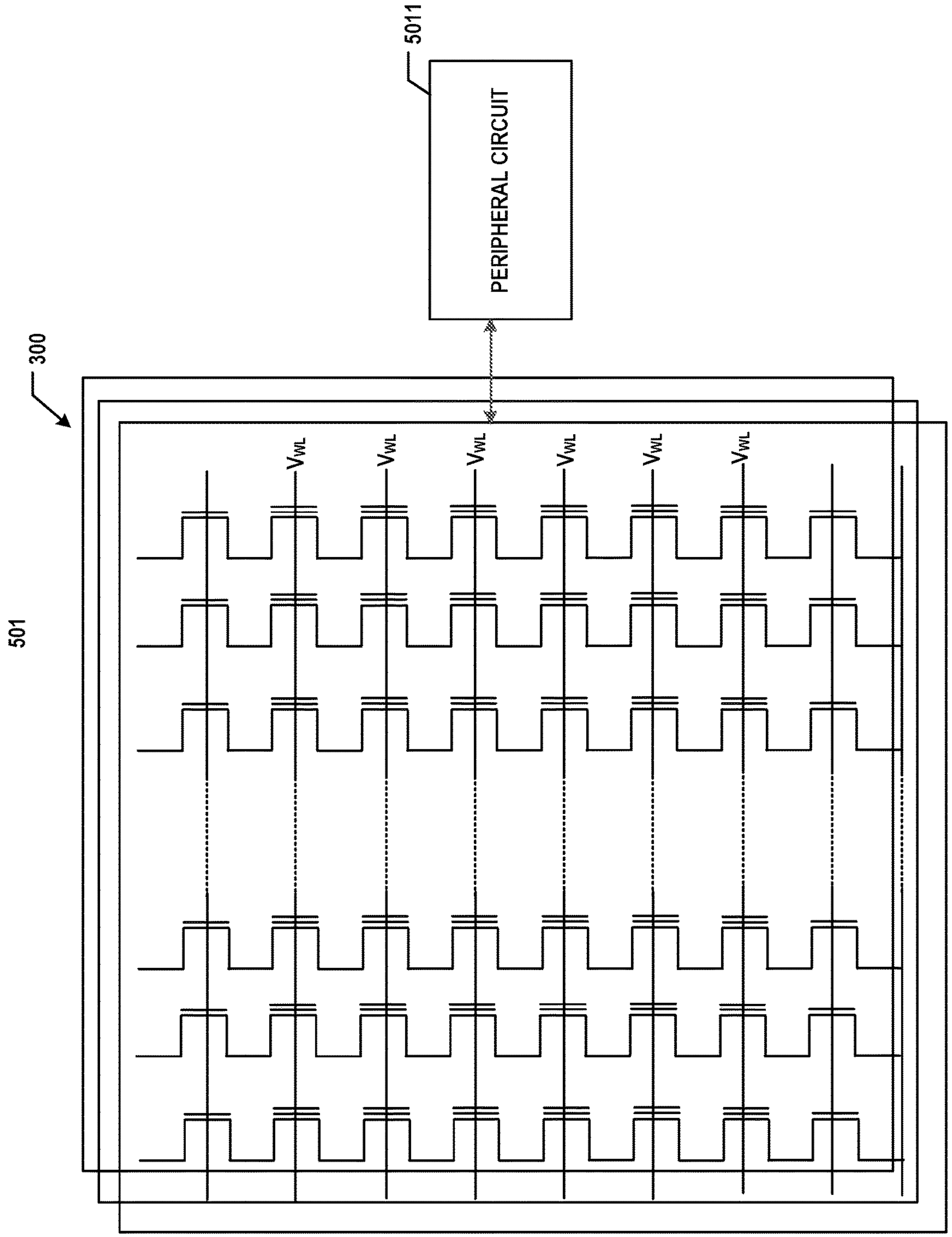
FIG. 9 is a schematic structural diagram of a memory device according to implementations of the present disclosure.

In order to solve the above technical problems, as shown in FIG. 9, some implementations of the present disclosure provide a memory device 501. Memory device 501 includes a memory array 300 having a plurality of memory blocks, and a control circuit 5011 coupled to memory array 300. Each of the memory blocks is arranged to include a plurality of memory sub-blocks. Each memory sub-block includes at least one memory cell.

Control circuit 5011 is configured to, when performing multi-pass programming on a first memory block of the plurality of memory blocks, during a non-last pass programing of the memory cells in a first memory sub-block of the first memory block, determine verify loop counts of verify operations after programming the memory cells in the first memory sub-block of the first memory block to one or more first target program states; and using the same program and verify conditions as for the first memory sub-block, when programming the memory cells in other memory sub-blocks (e.g., a second memory sub-block) in the first memory block to the target program state, in the non-last pass programming of the memory cells of the other memory sub-blocks, at least the verify operation corresponding to the last of the verify loop (cycle) counts is not performed. It is noted that the first memory block may be any one of the plurality of memory blocks; the first memory sub-block may be any one of sub-blocks of the first memory blocks; the other memory sub-blocks may be memory sub-blocks of the first memory block except the first memory sub-block. It is noted that the target program state may not a final target program state after performing multi-pass program operation, but a target program state corresponding to each program operation in the multi-pass program operation. For instance, a first target program state is a corresponding target program state after performing first-pass program operation of the multi-pass program operation.

It should be noted that the memory devices described in the above-mentioned FIGS. 1 to 5 are only used to illustrate the relationship between memory cell strings, memory blocks, memory sub-blocks, and word lines in the memory device, and are not used for limiting the scope of the present disclosure. That is, the memory device described in this implementation may have the structures described in FIG. 1 to FIG. 5, or may be other implemented structures.

Here, based on the foregoing description, the memory cells in each memory sub-block in the memory block included in the memory device are respectively coupled to a plurality of word lines; and the memory cells of adjacent memory sub-blocks are coupled through word lines. On this basis, the programming operation may be applying a programming voltage (or called a programming pulse) to a selected word line among the plurality of word lines; and the verification operation may be applying a verification voltage to the selected word line. In some implementations, any pass programming in the multi-pass programming may include at least one programming loop, and in a part of the programming loop in the at least one programming loop, the verification voltage and the programming voltage/pulses are alternately applied to the selected word line. That is, usually, a programming loop includes a program operation and a verify operation. However, based on the method described in some implementations of the present disclosure, some verification operations may be skipped. Thus, the verify voltage is alternately applied to the selected word line with the program voltage/pulse for only part of the program cycle. Therefore, the time required for programming (tPROG) may be reduced, and the programming speed may be increased.

It should be understood that the multi-pass programming mentioned here may be two-pass programming, three-pass programming, four-pass programming, and so on. The non-last pass programming can refer to any pass coarse programming before the fine programming. That is, the non-last pass programming may refer to any pass coarse programming of at least one pass coarse programming.

Based on this, when the multi-pass programming is two-pass programming, that is, including one pass coarse programming and one pass fine programming, the non-last pass programming is the coarse programming. At this time, the determination of the verify loop count for performing the verify operation to program the memory cells in the first memory sub-block to the target program state during the non-last programming pass may be to determine the verify loop count for performing the verify operation after programming the memory cells in the first memory sub-block to the target program state during the coarse programming. When the multi-pass programming includes multi-pass coarse programming, the non-last pass programming can be any pass coarse programming in the multi-pass coarse programming. At this time, the determination of the verify loop count for performing the verify operation after programming the memory cells in the first memory sub-block to the target programming data state during the non-last pass programming may refer to determining verify loop count for performing the verify operation after programming the memory cells in the first memory sub-block to the target programming data state during a certain pass coarse programming.

It can be understood that when the multi-pass programming includes multi-pass coarse programming, for each pass coarse programming, the verify loop count for performing the verify operation after programming the memory cells in the first memory sub-block to the target programming data state can be determined.

For example, assuming that the multi-pass programming includes two pass coarse programming and one pass fine programming, then the non-last pass programming can be any one of the two pass coarse programming. For example, when the two-pass coarse programming is defined as the first-pass coarse programming and the second-pass coarse programming, the non-last pass programming can be the first pass coarse programming, or the second pass coarse programming. At this time, it is only possible to determine the verify loop count for performing the verify operation for the memory cells in the first memory sub-block to be programmed to the target programming data state during the first pass programming. It is also possible to determine the verify loop counts for performing the verify operation during the first pass coarse programming and during the second pass coarse programming after programming the memory cells in the first memory sub-block to the target programming data state. It is also possible to determine only the verify loop count for performing the verify operation after programming the memory cells in the first memory sub-block to the target program state during the second pass coarse programming. It should be understood that the verify loop count of the determined verify operation is only available if the non-last pass programming performed on other memory sub-blocks (except the first memory sub-block) corresponds to the non-last pass programming performed on the memory cells in the first memory sub-block. For example, it is assumed that the multi-pass programming performed on the first memory sub-block is a three-pass programming, and it is determined that a verify cycle count of performing a verify operation when a second pass coarse programming is performed on the first memory sub-block. And then, when the multi-pass programming of three-pass programming is also performed on the memory cells in other memory sub-blocks except for the first memory sub-block, only when the second-pass coarse programming is performed, the verify loop count of performing the verify operation when the second pass coarse programming is performed on the first memory sub-block can be determined, so as to reduce at least the last verify operation in the verify cycle count, thereby achieving the purpose of saving programming time.

It should also be noted that the "first" and "second" are only for the convenience of description, and are not used to limit the scope of the present disclosure. Similarly, the second memory cell described above or below can also be understood in this way. Based on the foregoing description of memory cell types, the target programming data state may include one or more target programming data states.

In some implementations, when the target programming data state includes one, it is only necessary to determine the verify loop count of the verify operation required after programming the memory cells in the first memory sub-block to the target programming data state. In some implementations, the target programming data state may also be any verifiable programming data state in coarse programming. For example, the target programming data state may be any programming data state in the above-mentioned SLC, MLC, TLC, and QLC except the erase data state.

In some implementations, when the target program state includes multiple states, the control circuit is further configured to respectively determine the verify loop count corresponding to the verify operation after programming the memory cells in the first memory sub-block to each target program state during the non-last pass programming.

It should be noted that, at this time, the target programming data state may also be any variety of verifiable programming data states in the coarse programming. For example, the target data programming state may include multiple programming data states in the above-mentioned MLC, TLC, and QLC, except for the erased data state. In this case, during the non-last pass programming operations, verify loop counts corresponding to verification operations that need to be performed after programming the memory cells in the first memory sub-block to each program state may be determined respectively. For example, when the target data programming state includes two states, for example, the two programming data states L1 and L2 in the above-mentioned QLC. At this time, during the non-last pass programming, it is necessary to determine the verify loop count corresponding to the verify operation required as 1 to program the memory cells in the first memory sub-block to L1; it is also necessary to determine the verify loop count corresponding to the verify operation required as 2 to program the memory cells in the first memory sub-block to L2. It should be understood that the memory cells programmed to L1 in the first memory sub-block are different from the memory cells programmed to L2 in the memory sub-block. As for which ones need to be programmed to L1 and which ones need to be programmed to L2, it is determined according to the instructions of the host mentioned above or below.

After the programming of the first memory sub-block is completed, for the programming of other memory sub-blocks of the same first memory block, the same program and verify conditions as for the first memory sub-block are used to program the other memory sub-blocks in the first memory block (except the first memory sub-block). When the memory cells in the memory sub-block are programmed to the target programming data state, the verify operation corresponding to the at least the last verify loop count is not performed in the non-last pass programming of the memory cells in the other memory sub-blocks. That is, the same program and verify conditions as for the first memory sub-block can be used to program the memory cells in other memory sub-block. When the memory cells in the other memory sub-blocks are programmed to the target programming data state, at least the verify operation corresponding to the last verify loop count is not performed in the non-last pass programming of the memory cells in the other memory sub-blocks. That is, when the first memory sub-block is programmed using the same programming and verification conditions, during the non-last programming, after the memory cells in the other memory sub-blocks are programmed to the target programming data state, the verify operation corresponding to at least the last verify loop count may be omitted.

In some implementations, when multi-pass program operations are performed on a first memory block of the memory blocks, during a non-last pass program of the memory cells in a first memory sub-block of the first memory block, m verify loop counts of verify operations are determined after programming the memory cells in the first memory sub-block of the first memory block to one or more first target program states, where m is an integer. And, when programming the memory cells in a second memory sub-block of the first memory block to the one or more first target program states using the same program and verify conditions as for the first memory sub-block of the first memory block for n times, where n is an integer, and n is more than 1 and less than m, during the n+1th to mth pass program of the memory cells in the second memory sub-block of the first memory block, the program voltage is applied to the memory cells in the second memory sub-block of the first memory block using the same program conditions as for the first memory sub-block of the first memory block.

In some implementations, when programming the memory cells in the second memory sub-block of the first memory block to the one or more first target program states using the same program and verify conditions as for the first memory sub-block of the first memory block for n times, where n is an integer, and n is more than 1 and less than m, after m+1th pass program of the memory cells in the second memory sub-block of the first memory block, the program voltage is prohibited to apply to the memory cells in the second memory sub-block of the first memory block.

In some implementations, prohibiting applying the program voltage to the memory cells in the second memory sub-block of the first memory block is performed by increasing a bit line voltage applied to bit lines coupled to the memory array. In some implementations, to prohibit applying the program voltage, the bit line voltage applied to bit lines coupled to the memory array may be increased to, for example, 2.0 V.

For example, when the target program state includes one, and the verify loop count is determined to be 5 times. And then, under the same programming and verification conditions, programming the memory cells in other memory sub-blocks (except the first memory sub-block) to the target programming data state can only perform the first 4 verify operations, omitting the last verify operation, thereby saving programming time. When the target programming data state includes two states, for example, L1 and L2, respectively, the determined verify loop count 1 is 6 times, and the determined verify loop count 2 is 7 times. At this time, under the same programming and verification conditions, the verify operations after the memory cells in any sub-block in the other memory sub-blocks are programmed to L1 can only be performed for the first 5 times, and the last verify operation is omitted. The verify operations after programming the memory cells in any memory sub-blocks of the other memory sub-blocks to L2 may only be performed for the first 6 times, and the last verify operation is not performed.

Based on the above description, the above-mentioned technical solution can be understood as follows: when performing multiple-pass programming on a certain memory block in the memory device, the verify loop counts required to perform verify operations after programming the memory cells in the certain memory sub-block of the memory block to the target program state is first determined during the non-last pass programming. And then, when the memory cells in other memory sub-blocks (e.g., a second memory sub-block) in the memory block are programmed to the same target programming data state using the same programming and verification conditions, during the non-last pass programming of the memory cells in the other memory sub-blocks, at least the verify operation corresponding to the last of the verify loop count is not performed. That is, when the memory cells in other memory sub-blocks are programmed to the same target programming data state using the same programming and verification conditions, during the non-last pass programming of the memory cells in the other memory sub-blocks, at least the verify operation corresponding to the last of the verify loop count is skipped, thereby saving more tPROG. As for the RWM, it can be considered in the final fine programming. It should be understood that the situation described here is that the multi-pass programming performed on the first memory sub-block is the same as the multi-pass programming performed on other memory sub-blocks in the same memory block. In other words, the multi-pass programming performed on the first memory sub-block is a two-pass programming, and then the multi-pass programming performed on other memory sub-blocks in the same memory block is also a two-pass programming. That is, the same programming/verify conditions can refer to performing the same multi-pass programming on memory cells in any memory sub-block in a certain memory block. The conditions include initial programming voltage/pulse, setting step size, verify voltage, verify operation, etc., and other relatively small change conditions. It should be noted that in some descriptions, the memory sub-blocks are also described as memory strings. For example, assuming that a certain memory block of the memory device has 6 memory sub-blocks. The 6 memory sub-blocks may be 6 strings, e.g., String0, String1, String2, String3, String4, and String5.

It should be understood that, when programming the memory cells in the memory sub-blocks to a certain target program state, the threshold voltages of some memory cells are within the threshold voltage distributions corresponding to the target program state after one program operation and one verify operation; while the threshold voltages of other memory cells may need multiple program operations and verify operations. As such, the verify loop count can be referred to the number of times required to program a last completed programmed memory cell in the first memory sub-block to the target program state.

In some implementations, after determining the verify loop count required to perform verify operations after programming the memory cells in the first memory sub-block of the memory block to each of the target program state, the control circuit is further configured to, according to the verify loop counts corresponding to each target program state, configuring the verify loop count required to perform verify operations after programming the memory cells in the other memory sub-block (e.g., second memory sub-block) to the target program state in a non-last pass programming.

In some implementations, the control circuit includes an external interface, through which the number of verification operations that need to be performed by the memory cells in the other memory sub-blocks in the non-last pass programming is configured.

It should be noted that the external interface may refer to the signal line 504 and the signal line 503 in the above-mentioned FIG. 5. It is used to receive, from the host, the number of verification operations that need to be performed for the memory cells in the other memory sub-blocks in the non-last pass programming. The current number of verification operations may be obtained according to the above-mentioned determined verify loop count.

In some implementations, when the verify strategy in the multi-pass programming adopts a predictive Fail Bit Count (FBC) verification. The predictive FBC verification is that during the programming process of a certain memory block, when the preset proportion of memory cells in the certain memory block have been programmed to the target programming data state, the remaining memory cells that have not been programmed to the target programming data state only need to perform one more program operation and do not need to perform a verify operation.

The control circuit is further configured to, when performing multi-pass programming on the first memory block, determine a program loop count for performing program operations to program the memory cells in the first memory sub-block to the target program state during the non-last pass programming; and when using the same programming and verification conditions as the first memory sub-block to program the memory cells in other memory sub-blocks (e.g., the second memory sub-block) in the first memory block to the target program state in the non-last pass programming of the memory cells, at least the program operation corresponding to the last program loop count is not performed.

In some implementations, the process of predictive FBC verification strategy may include: when performing multi-pass programming on a certain memory sub-block, no matter whether it is in the coarse programming stage or the fine programming stage, after several alternating programming operations and verification operations, a certain proportion (e.g., a preset proportion) of the memory cells in the memory sub-block have been programmed to the target programming data state, and only a part of the remaining memory cells have not been programmed to the target programming data state. Nevertheless, the intermediate data state of the part of the remaining memory cells not being programmed may be close to the target programming data state. As such, it is only necessary to perform another programming operation on the part of the remaining memory cells, and the part of the remaining memory cells is inevitably programmed to the target programming data state. Then, at this time, there is no need to perform another verification operation, and more tPROG can be saved. It should be noted that the preset proportion of the memory cells may be designed according to an actual memory device. For example, the preset proportion may be 90% or the like.

In some implementations, when a verify scheme (strategy) in the multi-pass program operations is the predictive FBC verification, the control circuit is configured to: when performing the multi-pass program operations on the memory cells in the first memory block, determine a program loop count for programming memory cells in the first memory sub-block of the first memory block to the first target program state during the non-last pass program of the memory cells in the first memory sub-block of the first memory block; and when programming the memory cells in a second memory sub-block of the first memory block to the one or more first target program states using the same program and verify conditions as for the first memory sub-block of the first memory block, during non-last pass program of the memory cells in the second memory sub-block of the first memory block, not perform at least the verify operation corresponding to the last of the verify loop counts.

For example, as shown in FIG. 10, when performing certain coarse programming in a multi-pass programming to memory cells coupled to a word line WL10 in a certain memory sub-block in a certain QLC type NAND flash memory device, its verification strategy uses the predictive FBC verification. At this point, in the coarse programming, after 5 alternating programming operations and verification operations, the memory cells are coupled to the WL10 word line. A certain proportion (such as 90%) of the memory cells has been programmed to the target programming data state, and only the remaining 10% of the memory cells have not been programmed to the target programming data state, while the intermediate programming data state of the remaining 10% of the memory cells is already close to the target programming data state. At this point, it is only necessary to perform one more programming operation on the remaining 10% of the memory cells. That is, to perform the sixth programming operation, the remaining 10% of the memory cells must be programmed to the target programming data state. This is foreseeable, and therefore it is unnecessary to do another verify operation.

In some implementations, the multi-pass program operations are performed on the first memory block of the memory blocks by programming memory cells in the first memory block to first verify levels (e.g., intermediate verify levels) with a first ISPP having a first step size during a first pass program and programming the memory cells to be second verify levels (e.g., final verify levels) with a second ISPP having a second step size during a last pass program. The first step size is larger than the second step size.

In some implementations, the predictive FBC verification is performed after programming the memory cells in the first memory block to the first verify levels with the first ISPP and after programming the memory cells in the first memory block to the second verify levels with the second ISPP.

Based on the above description, it can be seen that when the predictive FBC verification is adopted, one verification operation has actually been omitted. And then, by using the memory device provided by the implementations of the present disclosure, when the verification strategy in multi-pass programming adopts predictive FBC verification in the same memory block, it is only necessary to determine the verify loop count required after programming the memory cells in the first memory sub-block to the target programming data state, and when programming memory cells in the other memory sub-blocks (e.g., second memory sub-block), the verify operation corresponding to the last verify loop count can also be omitted, thereby saving more tPROG.

When the verification strategy in the multi-pass programming adopts predictive FBC verification, during the non-last pass programming in the multi-pass programming, in the case of passing the verification, and the programming of the memory cells that will be coupled to a certain word line is completed when reaching a certain programming data state, most of the memory cells have been programmed to the programming data state at this time. Only a small portion of memory cells remain unprogrammed to the programmed data state. At this time, the last programming operation is performed or not performed on the small portion of the memory cells, and the threshold voltage distributions of the memory cells coupled to the word line have very little difference. Then, in this case, when performing multi-pass programming on the first memory block, the program loop count required for performing the programming to the memory cells in the first memory sub-block to the target program state during the non-last pass programming may also be determined. Afterward, when the memory cells in other memory sub-blocks (e.g., second memory sub-block) in the first memory block are programmed to the target program state using the same programming and verification conditions as those for the first memory sub-block, the other memory sub-blocks in the non-last pass programming, at least the program operation corresponding to the last program loop count is not performed.

That is, when the verification strategy in multi-pass programming adopts predictive FBC verification, in the same memory block, it is only necessary to determine the program loop count of the program operation required to program the memory cells in a first memory sub-block to the target programming data state. When programming memory cells in other memory sub-blocks (e.g., second memory sub-block), the programming operation corresponding to the last program loop count can also be omitted.

Through the above description, when programming a first memory block, during the non-last pass programming, when performing multi-pass programming on the first memory block, according to the verify loop count and program loop count of a first memory sub-block of the first memory block, when programming other memory sub-blocks (e.g., a second memory sub-block) in the first memory block, at least one verify operation can be skipped. When using the predictive FBC verification scheme, at least one programming operation can also be skipped, so that tPROG can be greatly saved.

For RWM, it can be guaranteed in the stage of fine programming, which not only speeds up the programming speed but also ensures a wider RWM and ensures the reliability of programming.

For example, taking a memory block of a certain memory device as an example, the memory block has four memory sub-blocks (String), which are String0, String1, String2, and String3 in sequence. Each memory sub-block includes 128 word lines. The memory block includes 4 pages. And the memory cell in the memory block is a QLC-type memory cell. For a memory cell of the QLC type, multi-pass programming including a coarse programming stage and a fine programming stage is adopted. And in the coarse programming stage, the verification strategy adopted is the predictive FCB verification strategy. In this case, as shown in FIG. 11, which shows the verify information required of each programming data state for the memory cells of String® coupled to word line WL10 during the coarse programming stage. After adopting the programming method provided by some implementations of the present disclosure, the verify information required for programming the memory cells coupled to the word line WL10 in the String0 to each programming data state is determined. Then, the verify information required for programming the memory cells coupled to the word line WL10 in String1, String2, and String3 to each programming data state can be shown in FIG. 12. In FIG. 12, X indicates a verify operation that can be skipped (not performed). In this way, programming time can be saved.

Implementations of the present disclosure provide a memory device that, when a first memory block of the memory device performs multi-pass programming, by determining the number of verify operations required to program the memory cells in a first memory sub-block in the first memory block to a certain target programming data state during the non-last pass programming pass, and then when adopting the same programming and verification conditions to carry out the same multi-pass programming for other memory sub-blocks in the same memory block, according to the number of verify operations determined, it can reduce the number of verify operations when programming memory cells in other memory sub-blocks in the non-last pass programming. In this way, it ensures the read window margin, and the time required for the programming process can be reduced, and the programming (writing) speed of the memory device can be improved.

Figure 13:
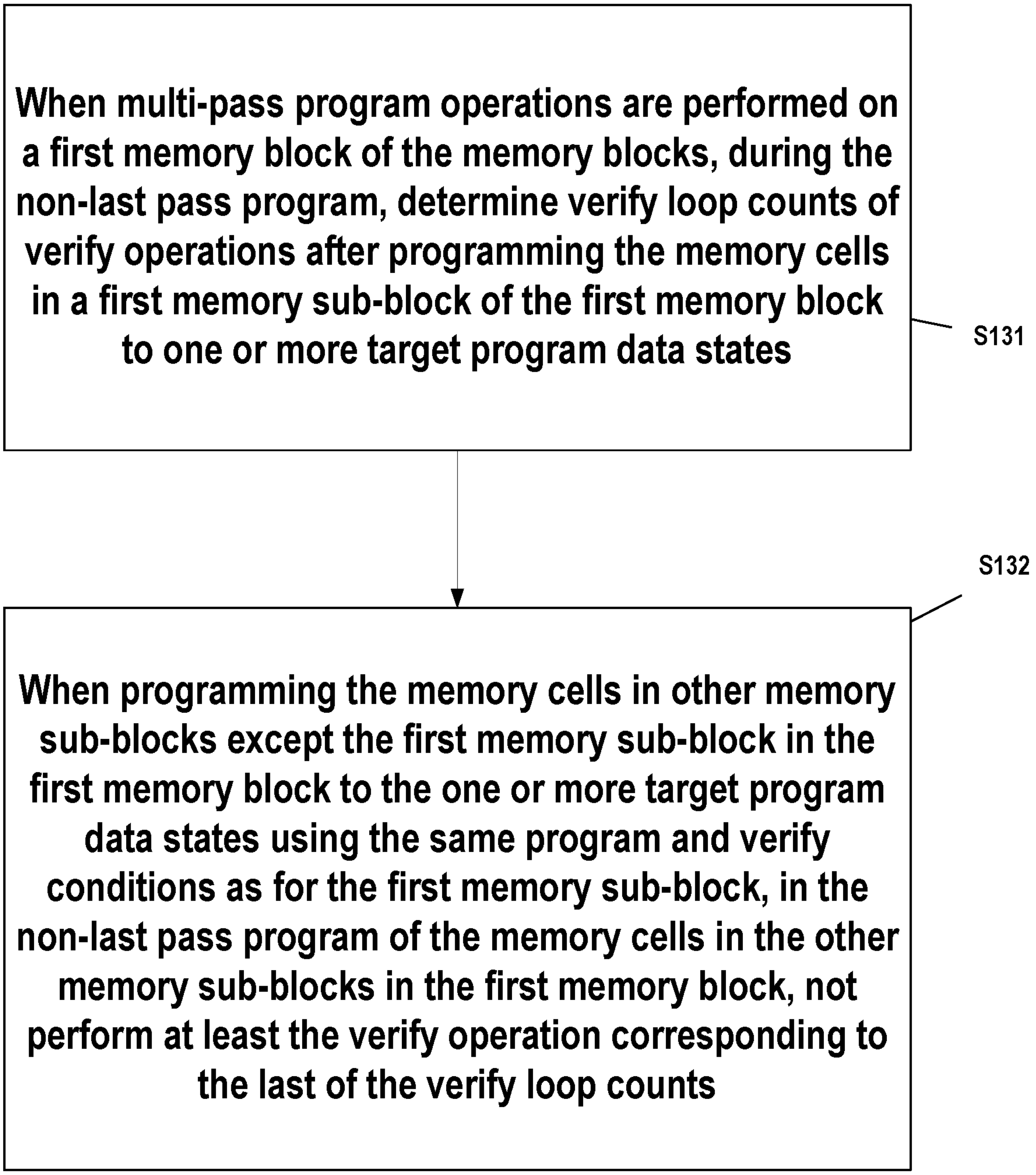
FIG. 13 is a schematic flowchart of a method for programming a memory device according to implementations of the present disclosure.

With the same or similar concept as described above, as shown in FIG. 13, some implementations of the present disclosure also provide a method for programming a memory device 501. Memory device 501 includes a memory array having a plurality of memory blocks. Each of the memory blocks is arranged as a memory array comprising a plurality of memory sub-blocks. Each memory sub-block includes at least one memory cell. A control circuit coupled to the memory array. The methods include:

S131: Determine the verify loop count of verify operations required after programming the memory cells in the first memory sub-block in the first memory block to the target program state during the non-last pass programming when performing multi-pass programming on the first memory block in the plurality of memory blocks.

S132: When programming the memory cells in other memory sub-blocks (e.g., second memory sub-block) in the first memory block to the target program state using the same programming and verification conditions as those for the first memory sub-block, in the non-last pass programming of memory cells, at least a verify operation corresponding to the last verify loop counts is not performed. The first memory block is any one of the plurality of memory blocks. The first memory sub-block is any one of the memory sub-blocks of the first memory block. The other memory sub-blocks (e.g., a second memory sub-block) are the memory sub-blocks in the first memory block, except for the first memory sub-block.

It should be noted that the execution subject of the method may refer to a control circuit. Based on this, for S131, that is: when the control circuit performs multi-pass programming on the first memory block, the verify loop count to perform a verification operation after the memory cells in the first memory sub-block is programmed to the target program state is determined during the non-last pass programming.

For S132, that is: when the control circuit uses the same programming and verification conditions as for the first memory sub-block to program the memory cells in other memory sub-blocks in the first memory block to the target program state in the non-last pass programming, at least a verify operation corresponding to the last of the verify loop counts is not performed.

In some implementations, the target program state includes one or more.

In some implementations, when the target program states include multiple data states, the program operation method further includes: respectively determining the verify loop count corresponding to the verification operation to program the memory cells in the first memory sub-block to each of the target program states.

In some implementations, the program verification method further includes: configuring the number of verify operations that need to be performed by the memory cells in the other memory sub-blocks in the non-last pass programming according to the determined verify loop count corresponding to each target program state.

In some implementations, when the verification strategy in the multi-pass programming is predictive FBC verification. The predictive FBC verification is that during the programming process of a certain memory block, when the preset proportion of memory cells in the certain memory block has been programmed to the target programming data state, the remaining memory cells that have not been programmed to the target programming data state only need to perform one more programming operation, and do not need to perform another verification operation. The programming operation method also includes: when performing multi-pass programming on the first memory block, determining a program loop count for programming memory cells in the first memory sub-block to the target program state during the non-last pass programming; when using the same programming and verification conditions as for the first memory sub-block to program the memory cells in other memory sub-blocks in the first memory block to the target program state in the non-last pass programming, at least the program operation corresponding to the last program loop count is not performed.

In some implementations, the memory cells in each memory sub-block are respectively coupled to a plurality of word lines. The memory cells of adjacent memory sub-blocks are coupled through a word line. The program operation is to apply a programming voltage/pulse to a selected word line among the plurality of word lines. The verify operation is applying a verify voltage to the selected word line. The verify voltage is alternately applied to the selected word line with the program voltage/pulse during a portion of the program loop of the multi-pass programming.

In some implementations, in each pass programming of the multi-pass programming, the programming voltage/pulse applied in the program operation is increased according to different set step sizes.

In some implementations, the multi-pass program operations are performed on the first memory block of the memory blocks by programming memory cells in the first memory block to first verify levels (e.g., intermediate verify levels) with a first ISPP having a first step size during a first pass program and programming the memory cells to be second verify levels (e.g., final verify levels) with a second ISPP having a second step size during a last pass program. The first step size is larger than the second step size.

In some implementations, the predictive FBC verification is performed after programming the memory cells in the first memory block to the first verify levels with the first ISPP and after programming the memory cells in the first memory block to the second verify levels with the second ISPP.

In some implementations, the memory array is a three-dimensional NAND memory array.

It should be noted that the method and the above-mentioned memory device may belong to the same or similar concept, and the nouns appearing in the method are all explained in detail in the above-mentioned memory device, and are also applicable here, and will not be repeated here.

Based on the same or similar concept as above, as shown in FIG. 14, some implementations of the present disclosure also provide a memory system 50 including a memory device 501. The memory device 501 includes a memory array with a plurality of memory blocks. Each of the memory blocks is arranged to include a plurality of memory sub-blocks. Each memory sub-block includes at least one memory cell. And a control circuit is coupled to the memory array. The control circuit is configured to determine the verify loop count for performing verify operations to program memory cells in a first memory sub-block of the first memory block to a target program state during a non-last pass programming; and when using the same programming and verification conditions as the first memory sub-block to program the memory cells in other memory sub-blocks (e.g., a second memory sub-block) in the first memory block to the target program state, in the non-last pass programming, at least the verify operation corresponding to the last of the verify cycle counts is not performed. The first memory block is any one of the plurality of memory blocks. The first memory sub-block is any one of the memory sub-blocks in the first memory block. The other memory sub-blocks are memory sub-blocks in the first memory block, except for the first memory sub-block. And, memory system 50 further includes controller 502 coupled to memory device 501 and configured to control memory device 501.

It should be noted that the memory system 50 may communicate with the above-mentioned host in FIG. 5. The host and/or the memory system 50 may be included in various products, such as Internet of Things (IoT) devices, refrigerators, sensors, motors, mobile communication devices, automobiles, driverless vehicles, etc. And the host and/or the memory system 50 may be used to support the processing, communication, or control of these products. In some implementations, memory system 50 may be a discrete memory or memory component of a host device. In some other implementations, the memory system 50 may also be a part of an integrated circuit, for example, a part of a System on Chip (SOC). At this point, memory system 50 is stacked or otherwise assembled with one or more components of the host. In other implementations, the above-mentioned memory system can be implemented and packaged in products such as memory cards and drives, as shown in FIG. 15(A) and FIG. 15(B). FIG. 15(A) shows a schematic diagram of an exemplary memory card with a memory system according to some aspects provided by the present disclosure. FIG. 15(B) shows a schematic diagram of an exemplary solid-state drive (SSD) with a memory system in accordance with aspects of the present disclosure. In one example as shown in FIG. 15(A), controller 502 of the memory system and memory device 501 may be integrated into memory card 150. Memory card 150 may include a PC card (Personal Computer Memory Card International Association (PCMCIA) card), CompactFlash (CF) card, Smart Media (SM) card, memory stick, multimedia card (e.g., MultiMediaCard (MMC), Reduced-Size MultiMediaCard (RS-MMC), or MultiMediaCard micro (MMC micro)), Secure Digital (SD) card (SD, mini SD, micro SD, or Secure Digital High Capacity (SDHC)), Universal Flash Storage (UFS), etc. The memory card 150 may also include a memory card connector 1501 that couples to the memory card 150 with a host (e.g., the host in FIG. 5). In another example as shown in FIG. 15(B), the controller 502 and the plurality of memory devices 501 may be integrated into the SSD 151. SSD 151 may also include SSD connector 1511 that couples to SSD 151 with a host (e.g., the host in FIG. 5). In some implementations, the storage capacity and/or operating speed of SSD 151 is greater than the storage capacity and/or operating speed of memory card 150.

In some implementations, the host may include a processor and a host Random Access Memory (RAM), where the host RAM may include Dynamic Random Access Memory (DRAM), Synchronous DRAM (SDRAM), or any other suitable volatile or nonvolatile memory device. One or more communication interfaces may be set on the memory system 50 to communicate with one or more components in the host. One or more components in the host may be Serial Advanced Technology Attachment (SATA) interface, Peripheral Component Interconnect Express (PCIe) interface, Universal Serial Bus (USB) interface, Universal Flash Storage (UFS) interface, embedded MultiMedia Card (eMMC™) interface, etc. The host may also include electronics, a memory card reader, or one or more other electronics external to memory system 50.

In some implementations, the controller 502 can receive instructions from the host and communicate with the memory device 501. For example, the controller 502 may transfer data to one or more memory cells, memory planes, memory sub-blocks, memory blocks or pages of the memory devices 501 by executing a write or erase command. The controller 502 may also transmit the data to the host by executing a read command. In hardware, the controller 502 may include one or more controller units, circuits or components configured to control access across the memory device 501 and provide a translation layer between a host and the memory system 50. The controller 502 may also include one or more input/output (I/O) circuits, wires, or interfaces to transfer data to and from the memory device 501. Controller 502 may also include a memory management unit and an array control unit.

The memory management unit may include circuit hardware or firmware, such as multiple components or integrated circuits associated with various memory management functions, taking NAND memory as an example of memory system operation or management functions. Those skilled in the art will appreciate that other forms of nonvolatile memory may have the same or similar memory operation or management functions that can be implemented in the present disclosure. The management functions of the NAND memory may include wear leveling, such as garbage collection or recycling, error detection or correction, block retirement, or one or more other memory management functions. The memory management unit can process the instructions of the host into commands recognizable by the memory system 50, for example, parse or format the instructions received from the host into commands related to the operation of the memory device 501. The memory management unit may also generate device commands for the array control unit or one or more other components of the memory system 50, such as implementing various memory management commands for processing functions.

The memory management unit may be configured to include a set of management tables for maintaining various information associated with one or more components of the memory system 50, e.g., the memory array of the memory device 501. For example, the management table may contain information such as block age, block erase count, error history, or one or more error counts of one or more memory blocks coupled to the controller 502. The error count may include operation error count, read bit error count, and the like. In some implementations, when the detected error count is above a certain threshold, the bit error is an uncorrectable bit error. In some implementations, a management table may maintain a count of correctable or uncorrectable bit errors, and the like. The management tables may also contain one or more Logical-to-Physical (L2P) tables containing one or more L2P pointers associated with physical addresses at said memory device 501 using logical addresses. In some implementations, the management table may contain an unencrypted L2P table and/or an encrypted L2P table. The unencrypted L2P table may include L2P pointers indicating unencrypted logical addresses and unencrypted physical addresses, and the encrypted L2P table may contain encrypted physical addresses and encrypted L2P pointers to unencrypted logical addresses. In an actual application process, the management table may be displayed at the memory management unit. That is, the management table may be stored in the RAM of the controller 502. In some implementations, the management table may also be stored in the memory device 501. When in operations, the memory management unit can read part or all of the cached management table from the RAM of the controller 502. The management table may also be read from the memory device 501.

The array control unit may include circuitry or components configured to control the completion of the following related memory operations. For example, the array control unit controls writing data to one or more memory cells of the memory system 50 coupled to the controller 502, and reading or erasing data from the one or more memory cells. The array control unit may receive a command sent by the host, or a host command internally generated by the memory management unit. The host command may be a command associated with wear leveling, error detection or correction, and the like.

The array control unit may also include an error correction code (ECC) component, which may include an ECC engine or other circuitry for detecting or correcting errors associated with it. The relevant error may be errors that may occur in the process of writing data to one or more memory cells in the memory system 50 coupled to the controller 502, or errors that may occur in the process of reading data from the one or more memory cells. The controller 502 is configured to effectively detect and recover from error events associated with various operations or data storage, such as bit errors, operation errors, etc., while maintaining the integrity of data transferred between the host and memory system 50, or the integrity of stored data. For example, Redundant Array of Independent Disks (RAID) storage, etc. may be used to remove and retire failed memory resources such as memory cells, memory arrays, memory pages, memory blocks, etc., to prevent future errors.

In the above memory system, in some implementations, when the target program state includes multiple data states, the control circuit is further configured to determine the verify loop counts corresponding to the verify operation to be performed when the memory cells in the first memory sub-block are programmed to each of the target program states during the non-last pass programming, respectively.

In some implementations, the control circuit is further configured to, according to the determined verify loop count corresponding to each target data program state, configure the number of verify operations needed to be performed for the memory cells in the other memory sub-blocks in the non-last pass programming.

In some implementations, when the verification strategy in the multi-pass programming is predictive FBC verification. The predictive FBC verification is that during the programming process of a certain memory block, when the preset proportion of memory cells in the certain memory block have been programmed to the target program state, the remaining memory cells that have not been programmed to the target program state only need to perform one more programming operation, and do not need to perform another verification operation. The control circuit is further configured to when performing multi-pass programming on the first memory block, determining a program loop count for programming memory cells in the first memory sub-block to the target programming data state during the non-last pass programming; and when using the same programming and verification conditions as the first memory sub-block to program the memory cells in other memory sub-blocks in the first memory block to the target program state in the non-last pass programming, at least the program operation corresponding to the last program cycle count is not performed.

In some implementations, the memory cells in each memory sub-block are respectively coupled to a plurality of word lines. The memory cells of adjacent memory sub-blocks are coupled through word lines, and the program operation is to apply a programming voltage/pulse to a selected word line among the plurality of word lines. The verify operation is to apply a verification voltage to the selected word line. The verify voltage and the program voltage/pulse are alternately applied to the memory cells of the selected word line during a portion of the program loop of the multi-pass programming.

In some implementations, in each programming pass of the multi-pass programming, the programming voltage/pulse applied in the programming operation is increased according to different preset step sizes.

In some implementations, the memory array is a three-dimensional NAND memory array; and the memory system is a three-dimensional NAND memory system.

It should be noted that the memory system includes the above-mentioned memory device. Therefore, the two elements that have the same or similar technical features, or using the same nouns appearing in the memory system are explained in detail in the above-mentioned memory device, which are also applicable here, and are not repeated here.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents. Although specific configurations and arrangements are discussed, it should be understood that this is done for illustrative purposes only. As such, other configurations and arrangements can be used without departing from the scope of the present disclosure. Also, the subject matter as described in the present disclosure can also be used in a variety of other applications. Functional and structural features, as described in the present disclosures can be combined, adjusted, modified, and rearranged with one another in ways that are consistent with the scope of the present disclosure.

What is claimed is:

1. A memory device, comprising: a memory array comprising memory blocks, wherein each of the memory blocks comprises memory sub-blocks, and each of the memory sub-blocks comprises at least one memory cell; and a control circuit coupled to the memory array, wherein the control circuit is configured to: when multi-pass program operations are performed on a first memory block of the memory blocks, during a first non-last pass program of memory cells in a first memory sub-block of the first memory block, determine verify loop counts of verify operations after programming the memory cells in the first memory sub-block of the first memory block to one or more first target program states; and when programming the memory cells in a second memory sub-block of the first memory block to the one or more first target program states using the same program and verify conditions as for the first memory sub-block of the first memory block, during a second non-last pass program of the memory cells in the second memory sub-block of the first memory block, not perform at least the verify operation corresponding to last of the verify loop counts, wherein the multi-pass program operations performed on the first memory block comprises the first non-last pass program performed on the first memory sub-block of the first memory block, the second non-last pass program performed on the second memory sub-block of the first memory block that is performed after the first non-last pass program, and a first last pass program that is performed after the second non-last pass program.

2. The memory device of claim 1, wherein programming the memory cells in the first memory sub-block of the first memory block to one or more first target program states comprises:

programming the memory cells in the first memory sub-block of the first memory block to multiple first target program states.

3. The memory device of claim 2, wherein when programming the memory cells in the first memory sub-block of the first memory block to the multiple first target program states, the control circuit is further configured to:

during the first non-last pass program of the memory cells in the first memory sub-block of the first memory block, determine each verify loop count of corresponding verify operations after programming the memory cells in the first memory sub-block of the first memory block to each of the first target program states.

4. The memory device of claim 3, wherein the control circuit is further configured to:

during the second non-last pass program of the memory cells in the second memory sub-block of the first memory block, set a number of verify operations that needs to be performed on the memory cells in the second memory sub-block of the first memory block according to each of the determined verify loop counts corresponding to the each of the first target program states.

5. The memory device of claim 1, wherein the multi-pass program operations are performed on the first memory block of the memory blocks by programming memory cells in the first memory block to first verify levels with a first Incremental Step Pulse Program (ISPP) having a first step size during the first non-last pass program and by programming the memory cells in the first memory block to second verify levels with a second ISPP having a second step size during the first last pass program, wherein the first step size is larger than the second step size.

6. The memory device of claim 1, wherein the control circuit is configured to:

when multi-pass program operations are performed on a second memory block of the memory blocks, during a third non-last pass program of memory cells in a first memory sub-block of the second memory block, determine verify loop counts of verify operations after programming the memory cells in the first memory sub-block of the second memory block to one or more second target program states; and when programming the memory cells in a second memory sub-block of the second memory block to the one or more second target program states using the same program and verify conditions as for the first memory sub-block of the second memory block, during a fourth non-last pass program of the memory cells in the second memory sub-block of the second memory block, not perform at least the verify operation corresponding to the last of the verify loop counts, wherein the multi-pass program operations performed on the second memory block comprises the third non-last pass program performed on the first memory sub-block of the second memory block, the fourth non-last pass program performed on the second memory sub-block of the second memory block that is performed after the third non-last pass program, and a second last pass program that is performed after the fourth non-last pass program.

7. A memory device, comprising: a memory array comprising memory blocks, wherein each of the memory blocks comprises memory sub-blocks, and each of the memory sub-blocks comprises at least one memory cell; and a control circuit coupled to the memory array, wherein the control circuit is configured to:

when multi-pass program operations are performed on a first memory block of the memory blocks, during a first non-last pass program of memory cells in a first memory sub-block of the first memory block, determine m verify loop counts of verify operations after programming the memory cells in the first memory sub-block of the first memory block to one or more first target program states, where m is an integer, and m is more than 1; and when programming the memory cells in a second memory sub-block of the first memory block to the one or more first target program states using the same program and verify conditions as for the first memory sub-block of the first memory block for n times, where n is an integer, and n is more than 1 and less than m, during the n+1th to mth pass program of the memory cells in the second memory sub-block of the first memory block, applying a program voltage to the memory cells in the second memory sub-block of the first memory block using the same program conditions as for the first memory sub-block of the first memory block, wherein the multi-pass program operations performed on the first memory block comprises the first non-last pass program performed on the first memory sub-block of the first memory block, and the n+1th to mth pass program performed on the second memory sub-block of the first memory block that are performed after the first non-last pass program.

8. The memory device of claim 7, wherein the control circuit is configured to:

when programming the memory cells in the second memory sub-block of the first memory block to the one or more first target program states using the same program and verify conditions as for the first memory sub-block of the first memory block for n times, where n is an integer, and n is more than 1 and less than m, after m+1th pass program of the memory cells in the second memory sub-block of the first memory block, prohibiting applying the program voltage to the memory cells in the second memory sub-block of the first memory block, wherein the multi-pass program operations performed on the first memory block further comprises the m+1th pass program performed on the second memory sub-block of the first memory block that is performed after the mth pass program.

9. The memory device of claim 8, wherein prohibiting applying the program voltage to the memory cells in the second memory sub-block of the first memory block is performed by increasing a bit line voltage applied to bit lines coupled to the memory array.

10. A program operation method for a memory device, wherein the memory device comprises a memory array, the memory array comprises memory blocks, each of the memory blocks comprises memory sub-blocks; each of the memory sub-blocks comprises at least one memory cell, and wherein the program operation method comprises:

when multi-pass program operations are performed on a first memory block of the memory blocks, during a first non-last pass program of memory cells in a first memory sub-block of the first memory block, determining verify loop counts of verify operations after programming the memory cells in the first memory sub-block of the first memory block to one or more first target program states; and when programming the memory cells in a second memory sub-block of the first memory block to the one or more first target program states using the same program and verify conditions as for the first memory sub-block of the first memory block, during a second non-last pass program of the memory cells in the second memory sub-block of the first memory block, not performing at least the verify operation corresponding to last of the verify loop counts, wherein the multi-pass program operations performed on the first memory block comprises the first non-last pass program performed on the first memory sub-block of the first memory block, the second non-last pass program performed on the second memory sub-block of the first memory block that is performed after the first non-last pass program, and a first last pass program that is performed after the second non-last pass program.

11. The method of claim 10, wherein programming the memory cells in the first memory sub-block of the first memory block to one or more first target program states further comprises:

programming the memory cells in the first memory sub-block of the first memory block to multiple first target program states.

12. The method of claim 11, wherein when programming the memory cells in the first memory sub-block of the first memory block to the multiple first target program states, the method further comprises:

during the first non-last pass program of memory cells in the first memory sub-block of the first memory block, determining each verify loop counts of corresponding verify operations after programming the memory cells in the first memory sub-block of the first memory block to each of the first target program states.

13. The method of claim 12, further comprising:

during the second non-last pass program of the memory cells in the second memory sub-block of the first memory block, setting a number of verify operations that needs to be performed on the memory cells in the second memory sub-block of the first memory block according to each of the determined verify loop counts corresponding to the each of the first target program states.

14. The method of claim 13, wherein the multi-pass program operations are performed on the first memory block of the memory blocks by programming memory cells in the first memory block to first verify levels with a first Incremental Step Pulse Program (ISPP) having a first step size during the first non-last pass program and by programming the memory cells in the first memory block to second verify levels with a second ISPP having a second step size during the first last pass program, wherein the first step size is larger than the second step size.

15. The method of claim 10, further comprising:

when multi-pass program operations are performed on a second memory block of the memory blocks, during a third non-last pass program of memory cells in a first memory sub-block of the second memory block, determining verify loop counts of verify operations after programming the memory cells in the first memory sub-block of the second memory block to one or more second target program states; and when programming the memory cells in a second memory sub-block of the second memory block to the one or more second target program states using the same program and verify conditions as for the first memory sub-block of the second memory block, during a fourth non-last pass program of the memory cells in the second memory sub-block of the second memory block, not performing at least the verify operation corresponding to the last of the verify loop counts, wherein the multi-pass program operations performed on the second memory block comprises the third non-last pass program performed on the first memory sub-block of the second memory block, the fourth non-last pass program performed on the second memory sub-block of the second memory block that is performed after the third non-last pass program, and a second last pass program that is performed after the fourth non-last pass program.

16. A memory system, comprising: a memory device, wherein the memory device comprises: a memory array comprising memory blocks, wherein each of the memory blocks comprises memory sub-blocks, and each of the memory sub-blocks comprises at least one memory cell; and a control circuit coupled to the memory array, wherein the control circuit is configured to:

when multi-pass program operations are performed on a first memory block of the memory blocks, during a first non-last pass program of memory cells in a first memory sub-block of the first memory block, determine verify loop counts of verify operations after programming the memory cells in the first memory sub-block of the first memory block to one or more first target program states; and when programming the memory cells in a second memory sub-block of the first memory block to the one or more first target program states using the same program and verify conditions as for the first memory sub-block of the first memory block, during a second non-last pass program of the memory cells in the second memory sub-block of the first memory block, not perform at least the verify operation corresponding to last of the verify loop counts, wherein the multi-pass program operations performed on the first memory block comprises the first non-last pass program performed on the first memory sub-block of the first memory block, the second non-last pass program performed on the second memory sub-block of the first memory block that is performed after the first non-last pass program, and a first last pass program that is performed after the second non-last pass program; and a memory controller coupled to the memory device and configured to control the memory device.

17. The memory system of claim 16, wherein when programming the memory cells in the first memory sub-block of the first memory block to multiple first target program states, the control circuit is further configured to:

during the first non-last pass program of the memory cells in the first memory sub-block of the first memory block, determine each verify loop count of corresponding verify operations after programming the memory cells in the first memory sub-block of the first memory block to each of the first target program states.

18. The memory system of claim 17, wherein the control circuit is further configured to:

during the second non-last pass program of the memory cells in the second memory sub-block of the first memory block, set a number of verify operations that needs to be performed on the memory cells in the second memory sub-block of the first memory block according to each of the determined verify loop counts corresponding to the each of the first target program states.

19. The memory system of claim 16, wherein the multi-pass program operations are performed on the first memory block of the memory blocks by programming memory cells in the first memory block to first verify levels with a first Incremental Step Pulse Program (ISPP) having a first step size during the first non-last pass program and by programming the memory cells in the first memory block to second verify levels with a second ISPP having a second step size during the first last pass program, wherein the first step size is larger than the second step size.

20. The memory system of claim 16, wherein the control circuit is configured to:

when multi-pass program operations are performed on a second memory block of the memory blocks, during a third non-last pass program of memory cells in a first memory sub-block of the second memory block, determine verify loop counts of verify operations after programming the memory cells in the first memory sub-block of the second memory block to one or more second target program states; and when programming the memory cells in a second memory sub-block of the second memory block to the one or more second target program states using the same program and verify conditions as for the first memory sub-block of the second memory block, during a fourth non-last pass program of the memory cells in the second memory sub-block of the second memory block, not perform at least the verify operation corresponding to the last of the verify loop counts, wherein the multi-pass program operations performed on the second memory block comprises the third non-last pass program performed on the first memory sub-block of the second memory block, the fourth non-last pass program performed on the second memory sub-block of the second memory block that is performed after the third non-last pass program, and a second last pass program that is performed after the fourth non-last pass program.

* * * * *